United States Patent
Kang et al.

(10) Patent No.: US 11,711,076 B2
(45) Date of Patent: Jul. 25, 2023

(54) POWER ON CONTROL CIRCUITS AND METHODS OF OPERATING THE SAME

(71) Applicant: TAIWAN SEMICONDUCTOR MANUFACTURING COMPANY, LTD., Hsinchu (TW)

(72) Inventors: Po-Zeng Kang, Hsinchu (TW); Wen-Shen Chou, Hsinchu (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/390,043

(22) Filed: Jul. 30, 2021

(65) Prior Publication Data

US 2022/0352887 A1  Nov. 3, 2022

Related U.S. Application Data

(60) Provisional application No. 63/182,123, filed on Apr. 30, 2021.

(51) Int. Cl.
| | |
|---|---|
| *H02M 3/158* | (2006.01) |
| *H03K 17/22* | (2006.01) |
| *H03K 19/0185* | (2006.01) |
| *H03K 17/687* | (2006.01) |
| *H03K 19/20* | (2006.01) |

(52) U.S. Cl.
CPC ......... *H03K 17/6872* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 6,078,207 | A * | 6/2000 | Oguri | H03K 5/023 327/321 |
| 6,563,353 | B2 * | 5/2003 | Chen | H03K 17/223 327/143 |
| 6,636,089 | B2 * | 10/2003 | Majcherczak | H03K 19/0016 327/143 |
| 8,373,446 | B2 * | 2/2013 | Manohar | H03K 17/223 327/143 |
| 9,344,079 | B2 * | 5/2016 | Kwon | G01R 19/2503 |
| 9,806,611 | B2 * | 10/2017 | Wang | H03K 17/223 |

(Continued)

*Primary Examiner* — Kenneth B Wells
(74) *Attorney, Agent, or Firm* — Hauptman Ham, LLP

(57) ABSTRACT

A semiconductor device includes a hysteresis block configured to generate an output voltage at corresponding disabling enabling voltage levels and a core-voltage-gated (CVG) device configured to receive a core voltage, an input terminal of the hysteresis block is coupled to a control node. The CVG device is configured to alter a control voltage at the control node so as to cause the output voltage of the hysteresis block to be generated at the disabling voltage level in response to the core voltage being at or below a first trigger level. Additionally, the CVG device is configured to alter the control voltage at the control node so as to cause the output voltage of the hysteresis block to be generated at the enabling voltage level in response to the core voltage being at or above a second trigger level, the second trigger level being above the first trigger level.

20 Claims, 19 Drawing Sheets

(56) References Cited

U.S. PATENT DOCUMENTS

| | | | |
|---|---|---|---|
| 11,201,618 B2* | 12/2021 | Wu .................... | H03K 17/6872 |
| 2010/0194200 A1* | 8/2010 | Kwon .................. | H03K 17/223 |
| | | | 307/52 |
| 2015/0091608 A1* | 4/2015 | Rajagopal ............ | H03K 19/007 |
| | | | 326/14 |

* cited by examiner

POWER ON CONTROL CIRCUITS AND METHODS OF OPERATING THE SAME

PRIORITY CLAIM

The present application claims the priority of U.S. Provisional Application No. 63/182,123, filed Apr. 30, 2021, which is incorporated herein by reference in its entirety.

BACKGROUND

Power-on control (POC) circuits monitor supply voltages and enable or disable circuit block(s). As semiconductor process technologies become more advanced, integration of devices having corresponding thin gate oxide layers, i.e., thin oxide devices (also known as core devices), for digital circuits and devices having corresponding thick gate oxide layers, i.e., thick oxide devices (also known as input/output (IO) devices), for analog devices becomes progressively more challenging. In particular, IO devices with thick oxide layers have larger dimensions and, thus, take up a greater area as compared to core devices with thin oxide.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
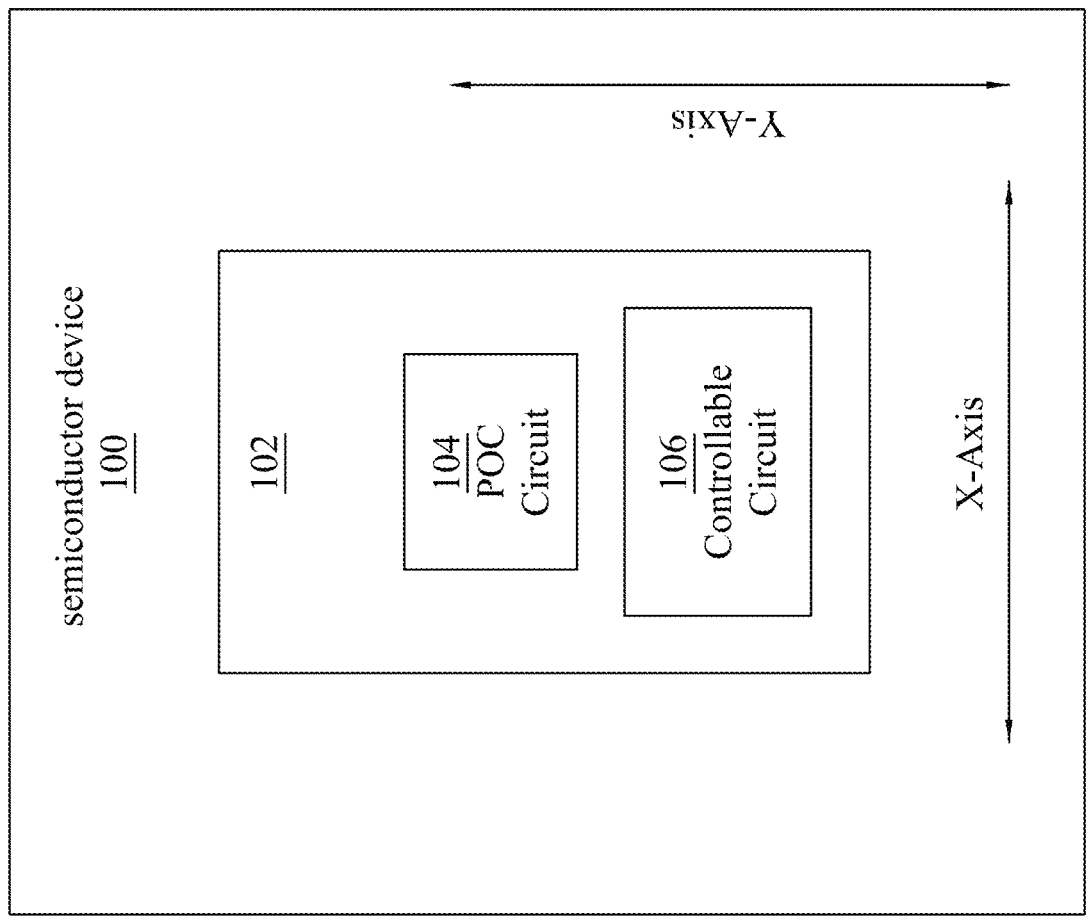
FIG. 1 is a block diagram of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, a semiconductor device includes a power-on control (POC) circuit used to enable and disable one or more circuit blocks. In some embodiments, the POC circuit includes a hysteresis block configured to generate an output voltage at a disabling voltage level and at an enabling voltage level and a core-voltage-gated (CVG) device configured to receive a core voltage. The CVG device is configured to cause the output voltage of the hysteresis block to be generated at the disabling voltage level in response to the core voltage being at or below a first trigger level. Additionally, the CVG device is configured to cause the output voltage of the hysteresis block to be generated at the enabling voltage level in response to the core voltage being at or above a second trigger level, the second trigger level being above the first trigger level.

FIG. 1 is a block diagram of a semiconductor device 100, in accordance with some embodiments.

In FIG. 1, semiconductor device 100 includes, among other things, a cell region 102. Cell region 102 includes a power-on control (POC) circuit 104. In some embodiments, POC circuit 104 is called a power-on reset region, start up control region, power up detector region, and/or a power loss detector region. The main function of POC circuit 104 is to detect/monitor an input level of a power supply voltage and to generate an output voltage that selectively enables or disables a controllable circuit (or circuits) depending on whether the power supply voltage reaches one or more trigger levels. In FIG. 1, POC circuit 104 is configured to generate an output voltage that enables or disables controllable circuit 106 depending on whether a core voltage reaches one or more trigger levels.

In general, core devices have relatively thin gate oxide layers and are referred to as thin gate oxide devices, thin gate devices or thin oxide devices. By contrast, input/output (IO) devices have relatively thick gate oxide layers and are referred to as thick gate oxide devices, thick gate devices or thick oxide devices. Example thicknesses for thin gate oxides and thick gate oxides vary according to the corresponding semiconductor process technology node. In some embodiments, thin gate oxides have a thickness t_thin in a range ($\approx$1.4 nm)$\leq$t_thin$\leq$($\approx$4 nm), and thick gate oxides have a thickness t_thick in a range (≈6 nm)≤t_thick≤(≈30 nm). Core voltage is the power supply voltage used for circuits formed from core devices. Core devices are generally used to form digital circuits. POC circuit 104 is supplied by an input/output (IO) power supply voltage. IO power supply voltage is generally used for circuits formed from IO devices. In some embodiments, POC circuit 104 is made only from core devices. In other embodiments, POC circuit 104 is made only from IO devices. In still other embodiments, POC circuit 104 is formed from both core devices and IO devices.

Figure 2A:
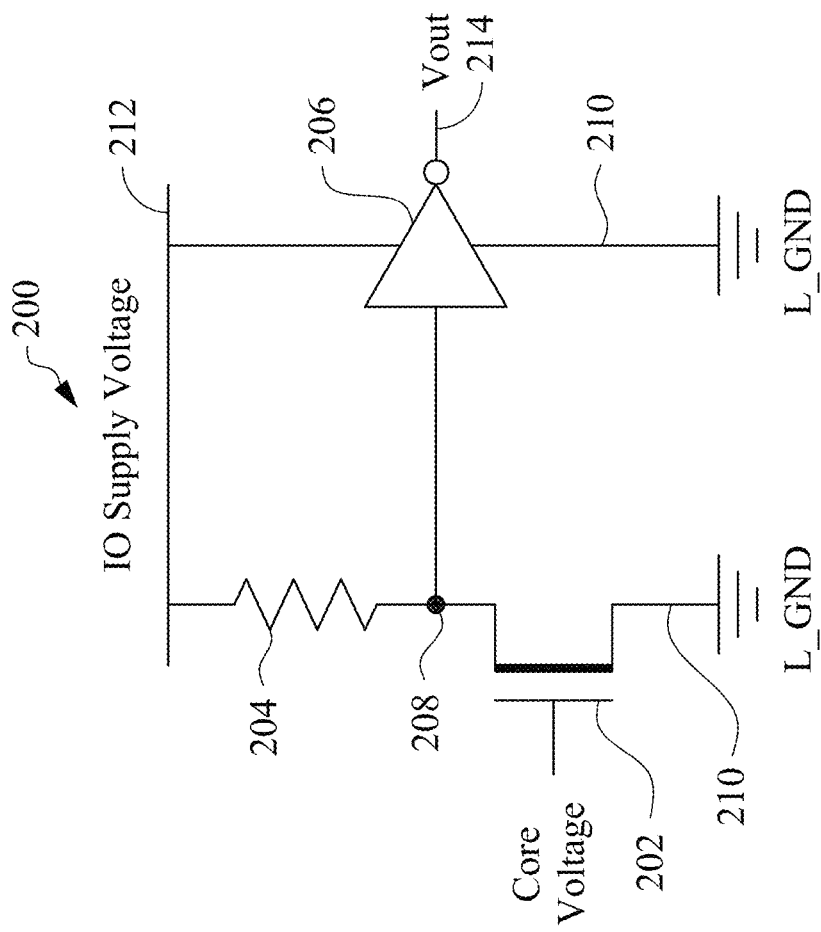
FIG. 2A is a block diagram of a POC, in accordance with some embodiments.

FIG. 2A is a block diagram of a POC circuit 200, in accordance with some embodiments.

POC circuit 200 is an example of POC circuit 104 in FIG. 1. POC circuit 200 includes a core-voltage-gated (CVG) device 202, a resistive device 204, and a hysteresis block 206. In FIG. 2A, CVG device 202 is an N-type Field-Effect Transistor (NFET). In other embodiments, CVG device 202 is a P-type Field-Effect Transistor (PFET). In still other embodiments, CVG device 202 includes multiple active semiconductor devices such as one or more NFETs and/or one or more PFETs.

In FIG. 2A, CVG device 202 is a thick gate transistor and so has a thick gate dielectric layer. CVG device 202 also has a drain connected to a control node 208, and a source connected to a ground node 210. In this example, the ground node 210 is configured to receive a typical ground voltage, whereas in some embodiments (e.g., FIG. 3) a ground node is configured to receive a ground voltage which is higher/greater than a typical ground voltage. Accordingly herein, because the typical ground voltage is lower than the higher/greater ground voltage of some embodiments (e.g., FIG. 3), the typical ground voltage is referred to as lower/low ground voltage L_GND, and the higher/greater ground voltage is referred to as higher/high ground voltage H_GND. In some embodiments, L_GND is 0 V. In some embodiments, L_GND is less than 0 V, i.e., negative.

Resistive device 204 is connected between a power supply node 212 and control node 208. In some embodiments, POC circuit 200 includes more than one resistive device. Resistive device 204 is a resistor. In other embodiments, resistive device 204 is a FET configured to behave as a resistor. Power supply node 212 is configured to receive an IO supply voltage which has a voltage level that is higher than a voltage level of the core voltage.

Hysteresis block 206 has an input which is coupled to control node 208, and an output node 214. Hysteresis block 206 is also coupled to power supply node 212 and ground node 210. Hysteresis block 206 is configured to generate an output voltage Vout at output node 214. Output voltage Vout is at (or near) the power supply voltage level of the IO supply voltage or is at (or near) the ground voltage level of the ground voltage (in this case, L_GND) depending on a voltage level of a control voltage at control node 208. In FIG. 2A, hysteresis block 206 is a Schmitt Trigger.

Figure 2B:
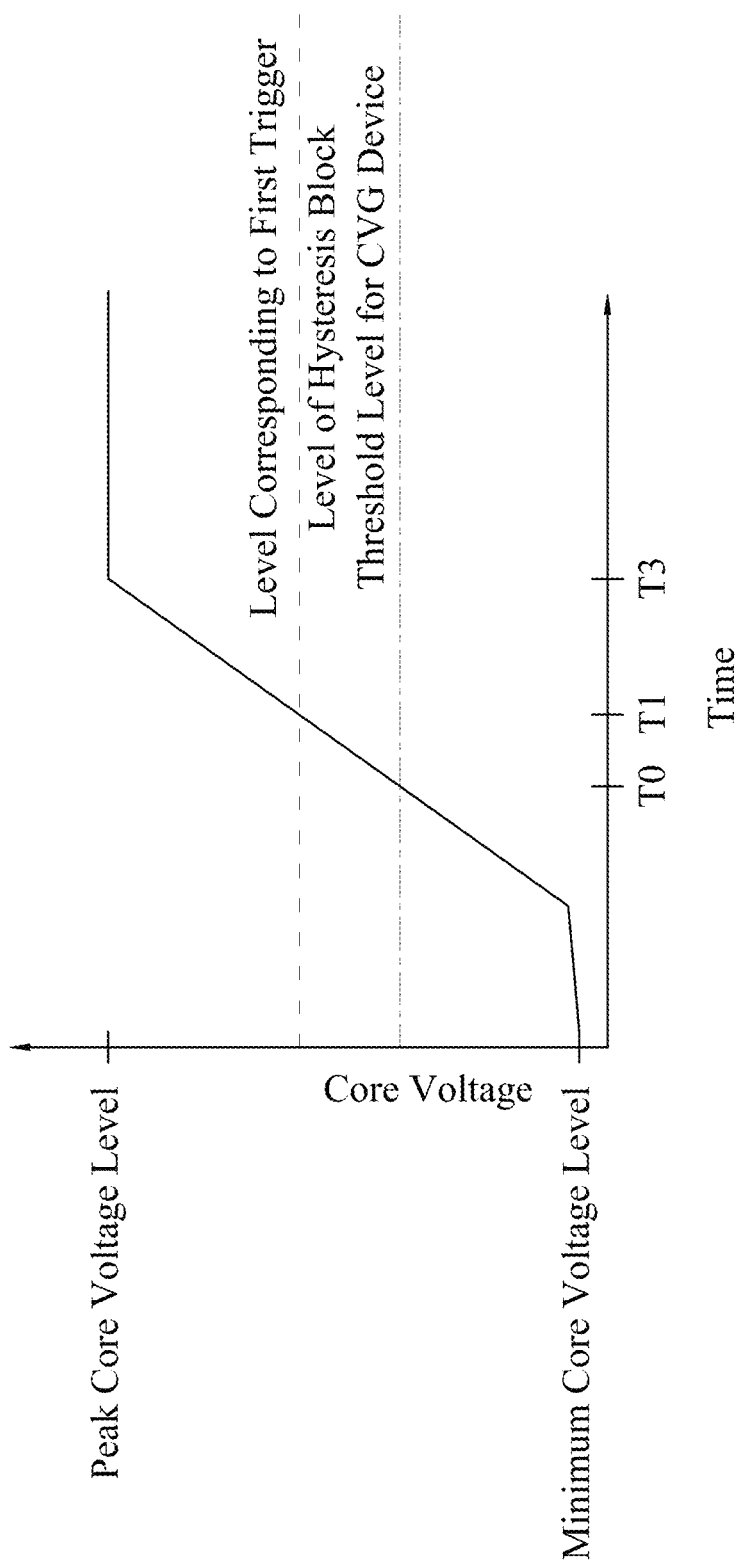
FIGS. 2B-2D are corresponding voltage diagrams of the operation of POC during an enablement operation, in accordance with some embodiments.
Figure 2C:
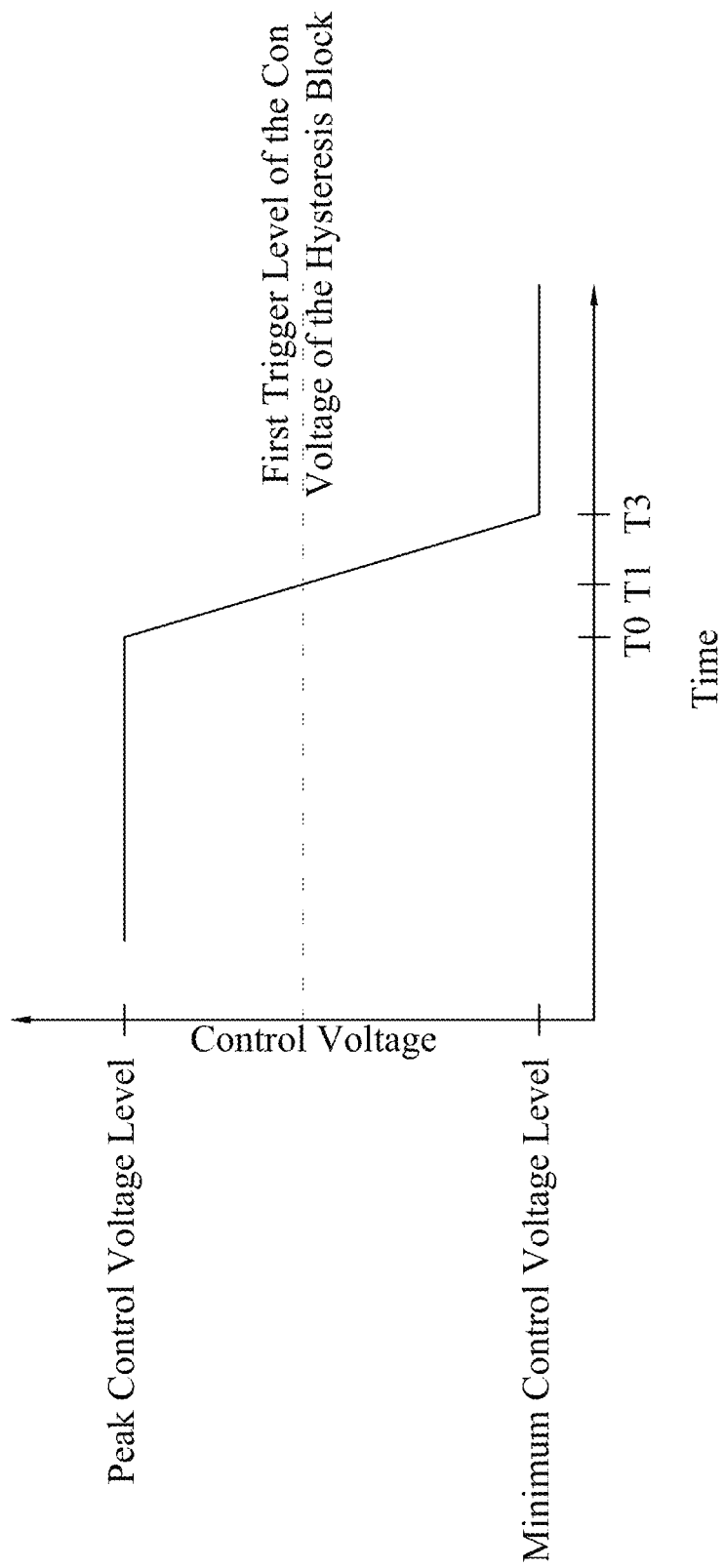
Figure 2D:
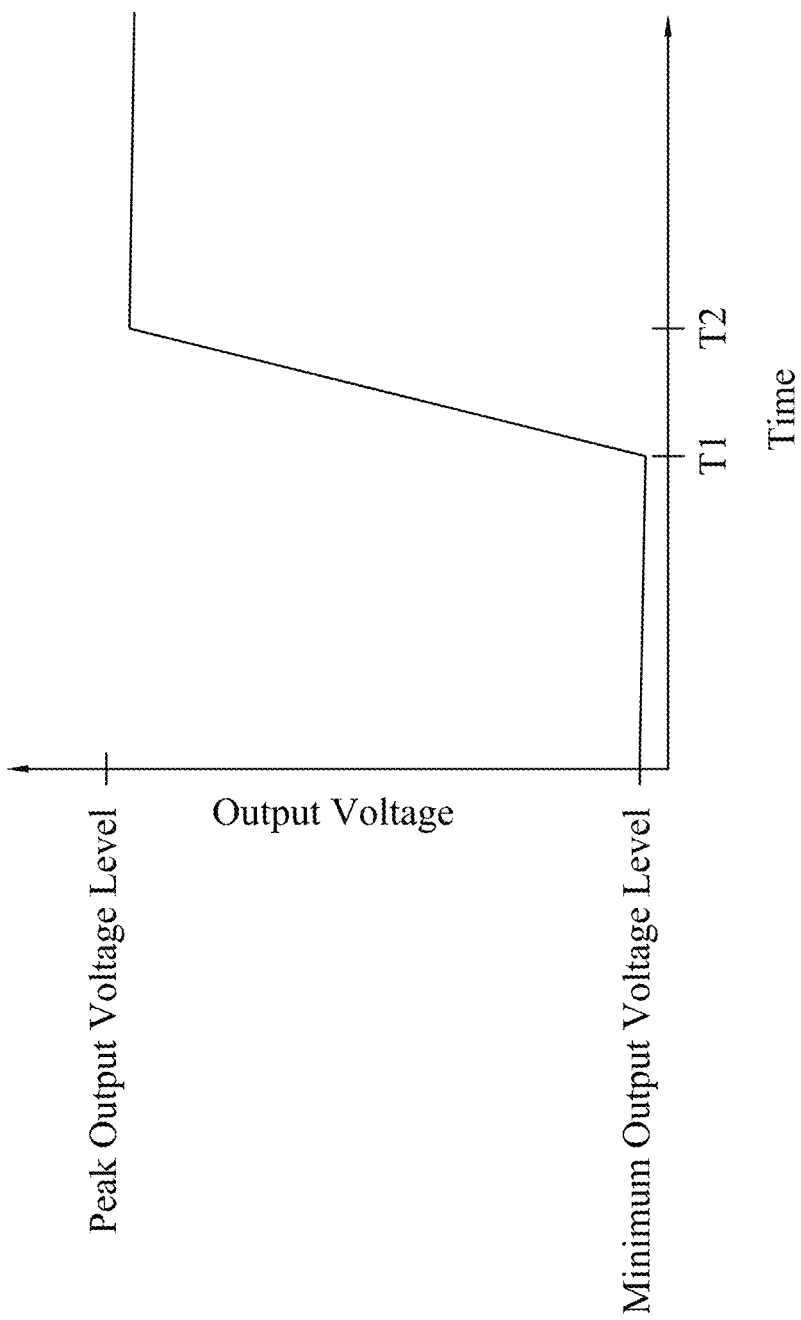

FIGS. 2B-2D are corresponding voltage diagrams of the operation of POC circuit 200 during an enablement operation, in accordance with some embodiments.

The enablement operation enables a controllable circuit (not shown in FIG. 2A, but see controllable circuit 106 in FIG. 1). FIG. 2B is a voltage diagram of the core voltage (Y-axis) versus time (X-axis) during the enablement operation. FIG. 2C is a voltage diagram of the control voltage (Y-axis) at control node 208 versus time (X-axis) during the enablement operation. FIG. 2D is a voltage diagram of the output voltage Vout at output node 214 versus time during the enablement operation.

In FIG. 2A at the beginning of the enablement operation, the core voltage begins to ramp up from a minimum level. Eventually, the core voltage reaches a peak level. In some embodiments, e.g., FIG. 2A, the minimum level of the core voltage is at a typical ground voltage level such as L_GND. In some embodiments (e.g., FIG. 3), the minimum level of the core voltage is at a ground voltage level such as H_GND. In some embodiments, the peak level of the core voltage level is at the IO supply voltage level.

As the core voltage increases, eventually the core voltage reaches, if not exceeds, the threshold voltage of CVG device 202 at time T0. As a result, when the core voltage reaches at least the threshold voltage of CVG device 202 at time T0, CVG device 202 turns on and begins to pull down the control voltage at control node 208 towards L_GND. As such, correspondingly, the voltage drop across resistive device 204 begins to increase.

In FIG. 2B, subsequent to time T0, i.e., at time T1, the core voltage is at or above a first trigger level of hysteresis block 206. Also, in FIG. 2C, at time T1, the control voltage at control node 208 has decreased to at or below the first trigger level of hysteresis block 206, as shown in FIG. 2C. Accordingly, at time T1, the output voltage Vout is triggered to begin ramping up from a minimum level of the output voltage at time T1 to a peak level of the output voltage at time T2, doing so quickly as shown in FIG. 2D. In some embodiments, the difference between T1 and T2 is sufficiently small that the output voltage waveform resembles a square wave. In some embodiments, the minimum level of the output voltage is at a ground voltage level such as L_GND. In some embodiments, the minimum level of the output voltage is at a ground voltage level such as H_GND. In some embodiments, the peak level of the output voltage is at the IO supply voltage level.

As the core voltage level continues to ramp up towards the peak level, CVG device 202 continues to pull down control node 208 towards L_GND. At time T3, the core voltage reaches the peak level in FIG. 2B and the control voltage reaches the minimum control voltage level (L_GND in FIG. 2A) in FIG. 2C. As a result, hysteresis block 206 continues to generate the output voltage Vout at output node 214 at the peak level of the output voltage at time T3 in FIG. 2D. In this case, the peak level of the output voltage, or nearly the peak level of the output voltage, represents an enabling voltage level for controllable circuit (not shown in FIG. 2A, but see controllable circuit 106 in FIG. 1). In this manner, CVG device 202 is configured to adjust the control voltage at control node 208 so as to cause the output voltage Vout of hysteresis block 206 to be generated at the enabling voltage level of controllable circuit (not shown in FIG. 2A, but see controllable circuit 106 in FIG. 1) in response to the core voltage being at or above first trigger level of hysteresis block 206.

Figure 2E:
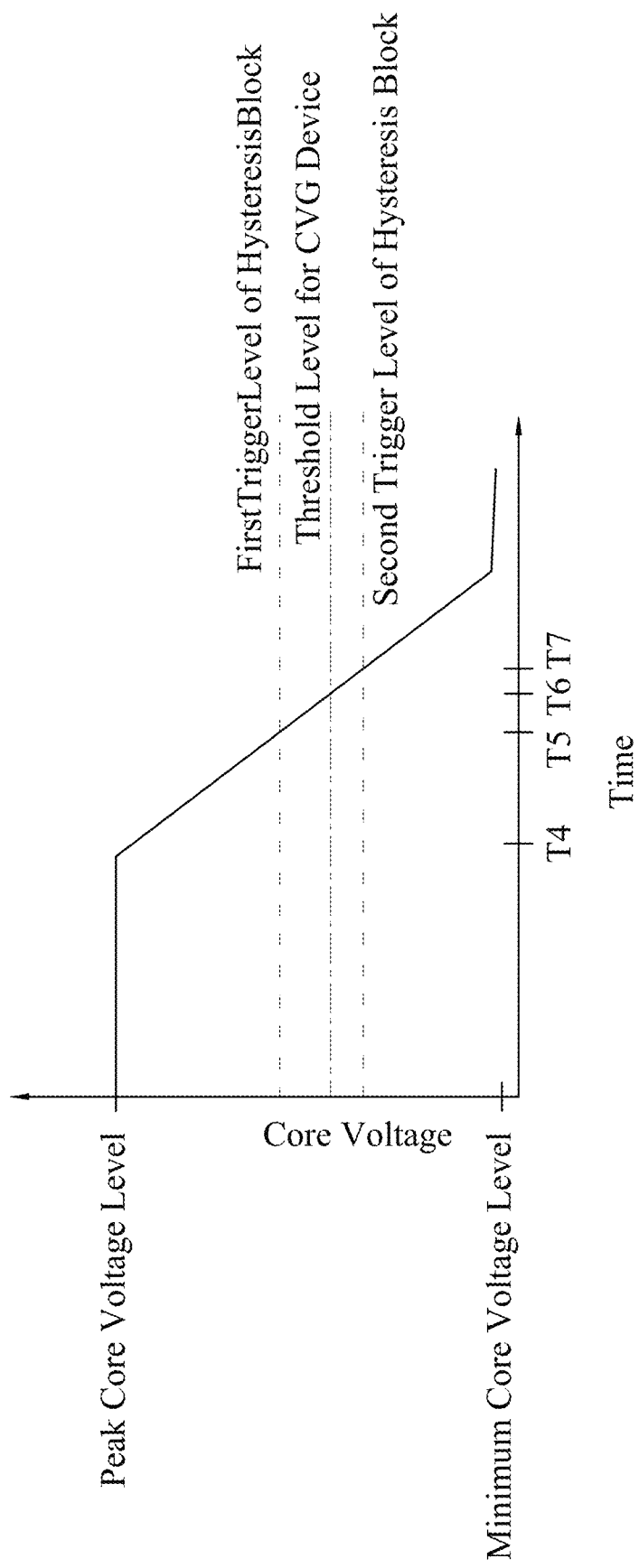
FIGS. 2E-2G are corresponding voltage diagrams of the operation of POC during a disablement operation, in accordance with some embodiments.
Figure 2F:
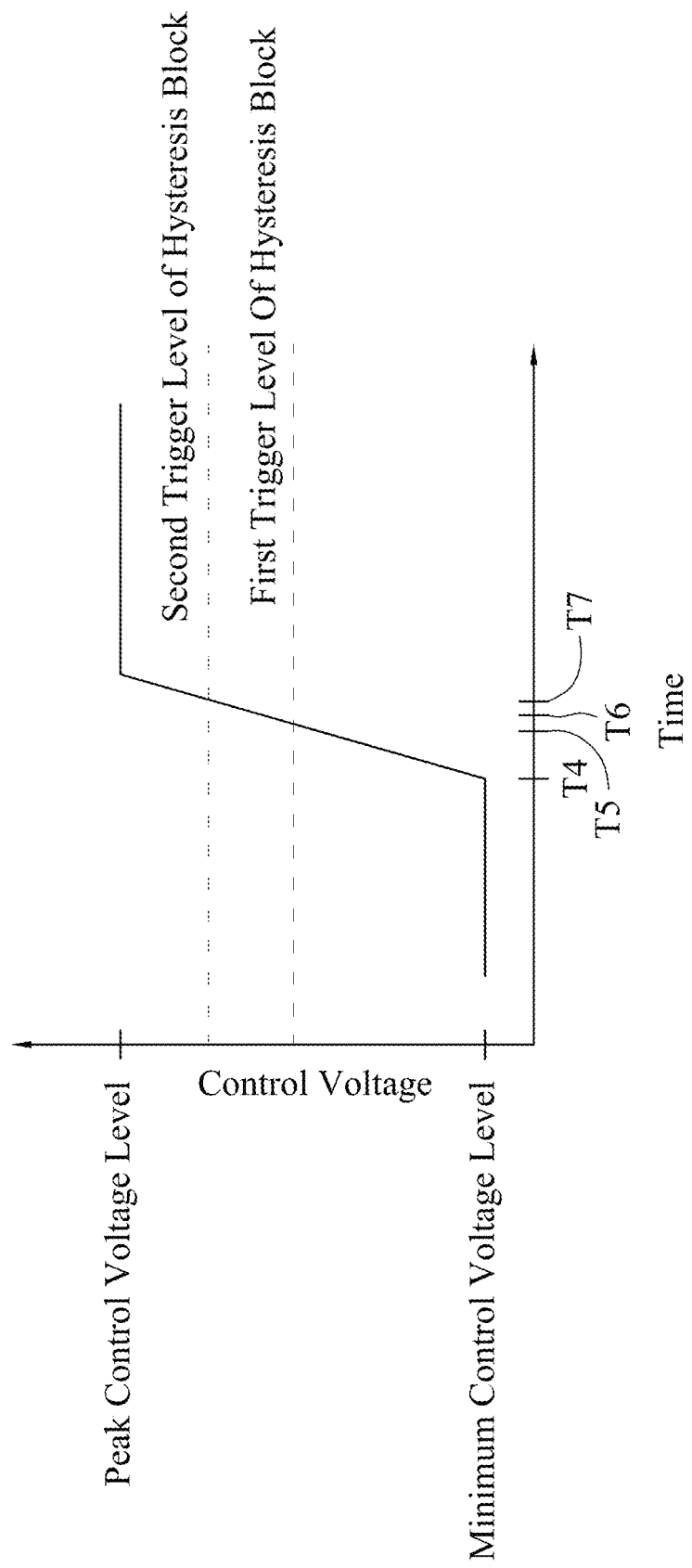
Figure 2G:
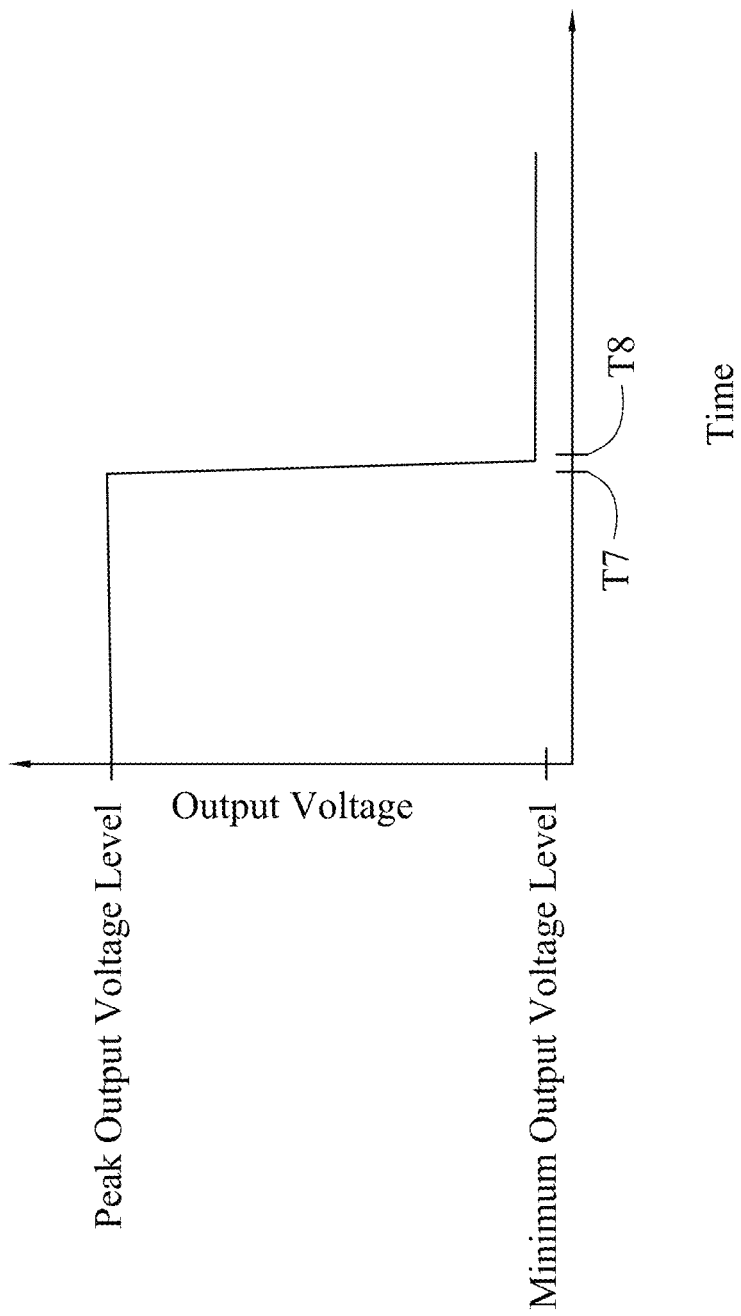

FIGS. 2E-2G are corresponding voltage diagrams of the operation of POC circuit 200 during a disablement operation, in accordance with some embodiments.

The disablement operation disables the controllable circuit (not shown in FIG. 2A, but see controllable circuit 106 in FIG. 1). FIG. 2E is a voltage diagram of the core voltage (Y-axis) versus time (X-axis) during the disablement operation. FIG. 2F is a voltage diagram of the control voltage (Y-axis) at control node 208 versus time (X-axis) during the disablement operation. FIG. 2G is a voltage diagram of the output voltage Vout (Y-axis) at output node 214 versus time during the disablement operation.

In FIG. 2E, at the beginning of the disablement operation, i.e., at time T4, the core voltage begins to ramp down from the peak level of the core voltage to the minimum level, which is L_GND in FIG. 2A. When the core voltage falls below the threshold voltage of CVG device 202 at time T6, CVG device 202 turns off and so CVG device 202 no longer pulls the control voltage at control node 208 down towards L_GND, resulting in the control voltage at control node 208 ramping from L_GND at time T4 in FIG. 2F towards the peak control voltage at a time T7. As such, the voltage drop across the resistive device 204 begins to decrease. Also, as the core voltage decreases in FIG. 2E, the control voltage on control node 208 in FIG. 2F increases not only to be at or above the first trigger level of hysteresis block 206 at a time T5, but also to be at or above a second trigger level of hysteresis block 206 at a time T7.

In FIG. 2F, at a time T7, the control voltage at control node 208 in FIG. 2F is at or above a second trigger level of hysteresis block 206. CVG device 202 is configured to adjust the control voltage at control node 208 so as to cause the output voltage Vout of hysteresis block 206 to be generated at the disabling voltage level of the controllable circuit (not shown in FIG. 2A, but see controllable circuit 106 in FIG. 1) in response to the core voltage being at or below second trigger level of hysteresis block 206. Accordingly, at time T7, the output voltage Vout is triggered to begin ramping down from the peak level of the output voltage to the minimum level of the output voltage at a time T8, doing so quickly as shown in FIG. 2G. In some embodiments, the difference between T7 and T8 is sufficiently small that the output voltage waveform resembles a square wave.

In terms of the control voltage of FIG. 2F, the first trigger level of hysteresis block 206 is above (greater than) the second trigger level of hysteresis block 206 such that there is a first voltage gap therebetween. However, in terms of the control voltage at control node 208 in FIG. 2F, the second trigger level of hysteresis block 206 is above (greater than) the first trigger level of hysteresis block 206 such that there is a second voltage gap therebetween. The second voltage gap in FIG. 2F provides hysteresis in the switching behavior of hysteresis block 206. The voltage gap between the first trigger level (that enables) and the second trigger level (that disables) fortifies enablement/disablement of POC circuit 200 against noise in the core voltage.

In some embodiments, a capacitance of CVG device 202 is small and thus the rate at which the output voltage Vout ramps up and ramps down is relatively fast compared to other approaches. In some embodiments, the ramping rate is as high as ≈10 V/μs. In some embodiments, POC circuit 200 also consumes a small amount of power especially when the resistance of resistive device 204 is relatively high (e.g., the resistance of resistive device 204 is such that a maximum current level across the resistive device 204 is a few μA or less). In some embodiments, the resistance of resistive device 204 is ≈1 Mega Ohm. In some embodiments in which the resistance of resistive device 204 is ≈1 Mega Ohm, the current that passes across resistive device 204 is as little as ≈1 μAmp.

Regarding FIGS. 2A-2G, POC circuit 200 is an example of POC circuit 104 in FIG. 1. In some embodiments, POC circuit 200 is made entirely from core devices. In some embodiments, POC circuit 200 is made entirely of IO devices. In some embodiments, POC circuit 200 is made from both IO devices and core devices.

Figure 3:
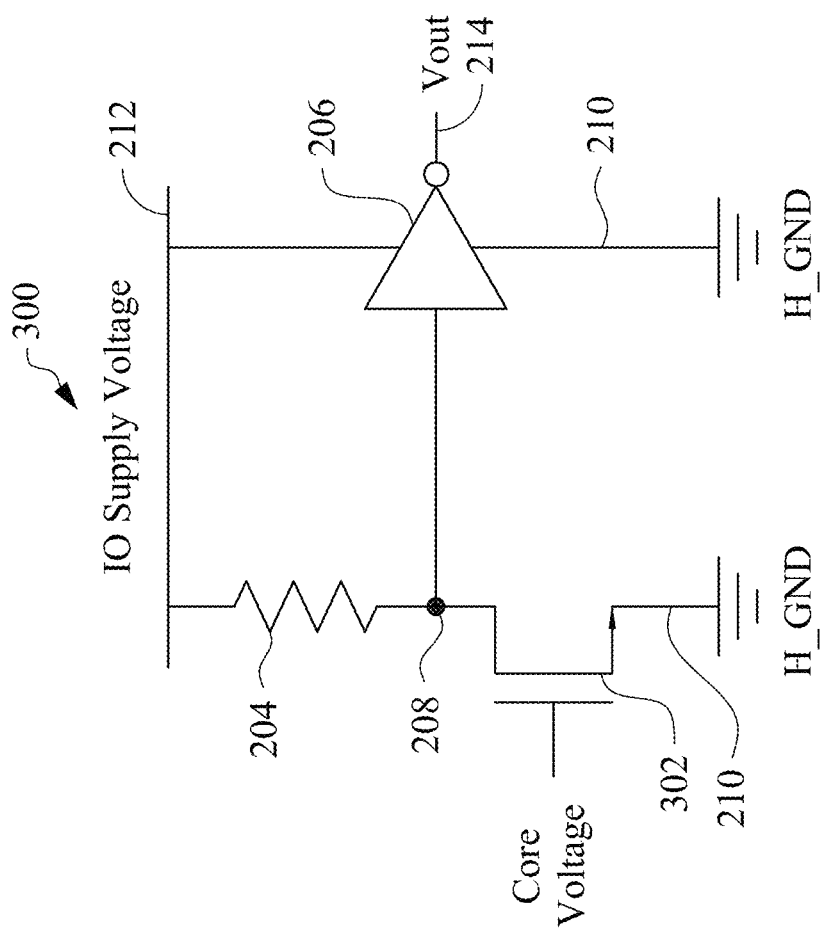
FIG. 3 is a block diagram of a POC, in accordance with some embodiments.

FIG. 3 is a block diagram of a POC circuit 300, in accordance with some embodiments.

POC circuit 300 is similar to POC circuit 200 in FIG. 2A and is also an example of POC circuit 104 in FIG. 1. Similar parts are labeled with the same element numbers in FIG. 3 as in FIG. 2A. Furthermore, for the sake of brevity, only the differences between POC circuit 300 and POC circuit 200 are discussed.

In FIG. 3, POC circuit 300 is much the same as POC circuit 200 in FIG. 2A with differences including: core-voltage-gated (CVG) device 302 is a thin gate transistor and so has a thin gate dielectric layer; and ground node 210 receives the high ground voltage H_GND instead of the low ground voltage L_GND as in FIG. 2A. The high ground voltage H_GND is at a positive ground voltage level above L_GND. In some embodiments, H_GND is ≈0.75 V relative to L_GND≈0 V. In some embodiments, this results in the minimum level of the core voltage, the minimum level of the control voltage, and the minimum level of the output voltage being near or at H_GND. As such, the voltage difference between the minimum level of the core voltage and the peak level of the core voltage, the difference between the minimum level of the control voltage and the peak level of the control voltage, and the difference between the minimum level of the output voltage and the peak level of the output voltage being correspondingly reduced since ground node 210 is held at H_GND rather than at L_GND. In some embodiments in which CVG device 302 is a thin gate transistor, setting ground node 210 at H_GND rather than at L_GND fortifies the gate dielectric layer of CVG device 302 to be less susceptible to breakdown/deterioration as compared to a circumstance in which ground node 210 is otherwise set at L_GND.

Figure 4A:
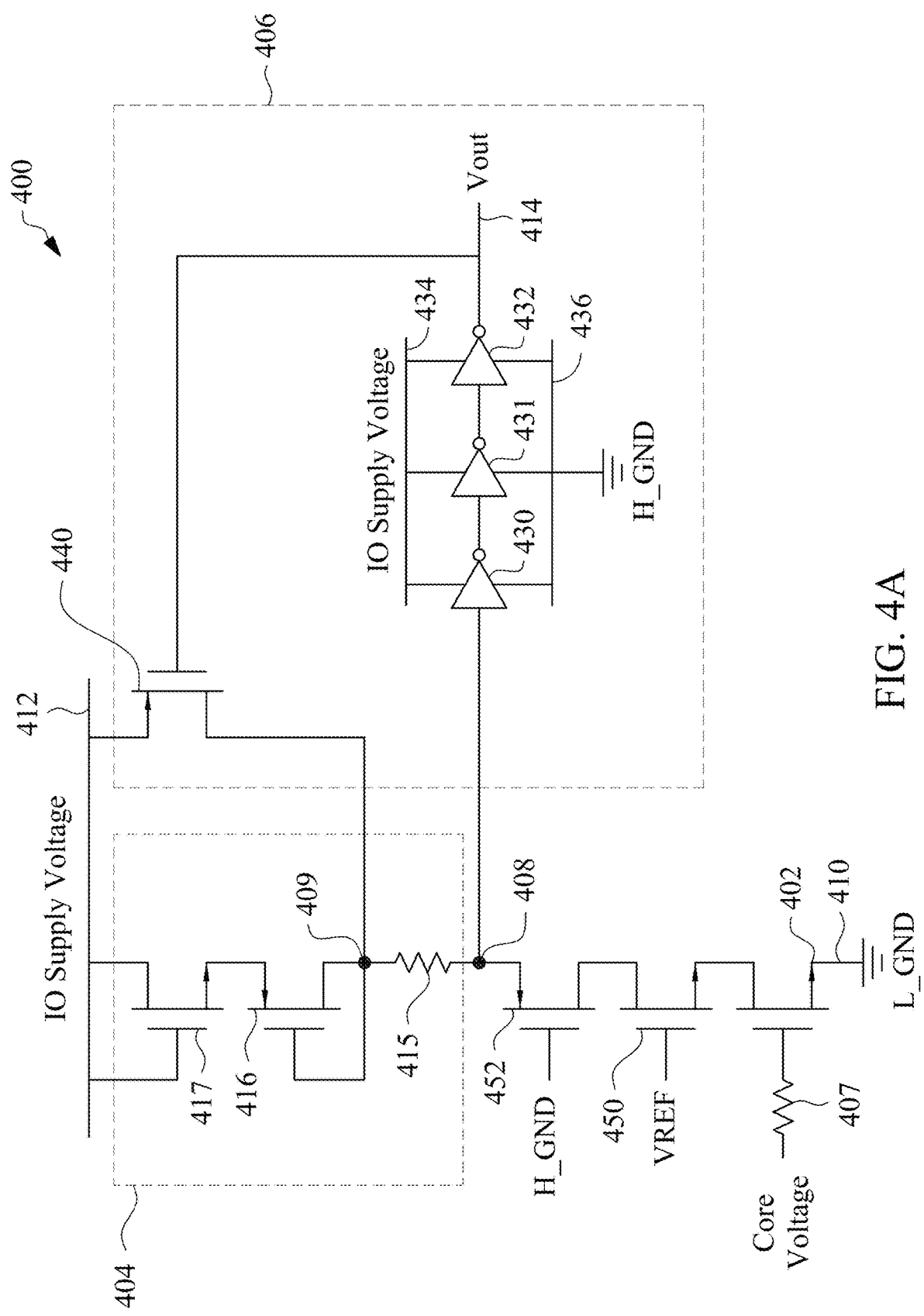
FIG. 4A is a circuit diagram of a POC, in accordance with some embodiments.

FIG. 4A is a circuit diagram of a POC circuit 400 in accordance with some embodiments.

POC circuit 400 in FIG. 4A is an example of POC circuit 104 in FIG. 1.

In FIG. 4A, control node 408 corresponds to control node 208 in FIG. 2A. CVG device 402 corresponds to CVG device 202 in FIG. 2A. Resistive block 404 corresponds to resistive device 204 in FIG. 2A. Hysteresis block 406 corresponds to hysteresis block 206 in FIG. 2A. In some embodiments, each of the active devices in FIG. 4A is formed from a corresponding core device. In FIG. 4A, POC circuit 400 further includes NFET 450 and PFET 452. NFET 450, PFET 452, and CVG device 402 are connected in series between control node 408 and ground node 410. NFET 450 is configured to set a voltage ceiling to the control node 408 while PFET 452 is configured to set a voltage floor to the control node 408, as explained in further detail below.

POC circuit 400 in FIG. 4A operates in a similar manner as POC circuit 200 in FIG. 2A. In FIG. 4A, CVG device 402 is also an NFET. In FIG. 4A, a gate of CVG device 402 is configured to receive the core supply voltage. The gate of CVG device 402 is connected in series with a resistor 407. Resistor 407 provides Electrostatic Discharge (ESD) protection. A source of the CVG device 402 is connected to a ground node 410, which corresponds to ground node 210 in FIG. 4A. Accordingly, ground node 410 is also configured to receive L_GND.

A drain of CVG device 402 is indirectly coupled to control node 408 but the drain of CVG device 402 is not connected to control node 408. More particularly, the drain of CVG device 402 is coupled to control node 408 through NFET 450 and PFET 452. A drain of NFET 450 is connected to a drain of PFET 452. A source of NFET 450 is connected to the drain of CVG device 402. A gate of NFET 450 is configured to receive a reference voltage VREF. In some embodiments, the voltage range applied to the gate of core supply device 402 is limited to the range of the core supply voltage. More specifically, the reference voltage VREF is set at the peak level of the core voltage. Accordingly, the drain of CVG device 402 (which is connected to source of NFET 450) cannot be pulled up higher than the peak level of the core voltage. As such, NFET 450 sets the voltage ceiling at control node 408 to be the peak level of the core voltage.

A source of PFET 452 is coupled and connected to control node 408. A gate of PFET 452 is configured to receive the high ground voltage H_GND. As such, PFET 452 prevents the voltage applied to control node 408 from dropping below the high ground voltage level of the high ground voltage. As such, PFET 452 sets the voltage floor at control node 408 to be the high ground voltage level.

Resistance block 404 includes multiple resistive devices. More specifically, resistance block 404 includes a resistor 415, a PFET 416, and an NFET 417. The resistor 415 has one end connected to control node 408 and an opposite end connected to an intermediary node 409. A gate and a drain of PFET 416 are both connected to intermediary node 409. Thus, PFET 416 is in a diode configuration. A source of PFET 416 is connected to a source of NFET 417. A gate and drain of NFET 417 are coupled to a power supply node 412. Thus, NFET 417 is in a diode configuration. Power supply node 412 corresponds to power supply node 212 in FIG. 2A. Power supply node 412 is configured to receive the IO supply voltage. PFET 416 and NFET 417 are configured to provide resistive loading and thus act as resistors connected in series with resistor 415. PFET 416 and NFET 417 provide a resistance with a relatively small area penalty compared to a resistor or resistors with the same resistance. Thus, in some embodiments, resistor 415, PFET 416, and NFET 417 together provide a same amount of resistance as resistive device 206 but consume less area.

In FIG. 4A, hysteresis block 406 is a Schmitt Trigger. Hysteresis block 406 includes inverter 430, inverter 431, and inverter 432 connected in series. An input terminal of inverter 430 is connected to control node 408. An output terminal of inverter 430 is connected to an input terminal of inverter 431. An output terminal of inverter 431 is connected to an input terminal of inverter 432. An output terminal of inverter 432 is connected to output node 414. Output node 414 corresponds to output node 214 in FIG. 2A. At output node 414, hysteresis block 406 is configured to generate output voltage Vout.

Each of inverters 430, 431, 432 has a high power terminal connected to a power supply rail 434. Power supply rail 434 is configured to receive the IO supply voltage. Each of inverters 430, 431, 432 has a low power terminal connected to a ground node 436. Ground node 436 is configured receive the high ground voltage H_GND. Accordingly, a peak of output voltage Vout is at the IO supply voltage level and a minimum level of output voltage Vout is at the high ground voltage level H_GND.

Hysteresis block 406 further includes a PFET 440. A source of PFET 440 is connected to power supply node 412. A drain of PFET 440 is connected to intermediary node 409. A gate of PFET 440 is connected to output node 414 and is thus configured to receive output voltage Vout. PFET 440 thus receives positive feedback from the output node 414, which adjusts the trigger level at which the inverters 430, 431, 432 are triggered to generate output signal Vout at the enabling voltage level and at the disabling voltage level, as explained in further detail below.

Figure 4B:
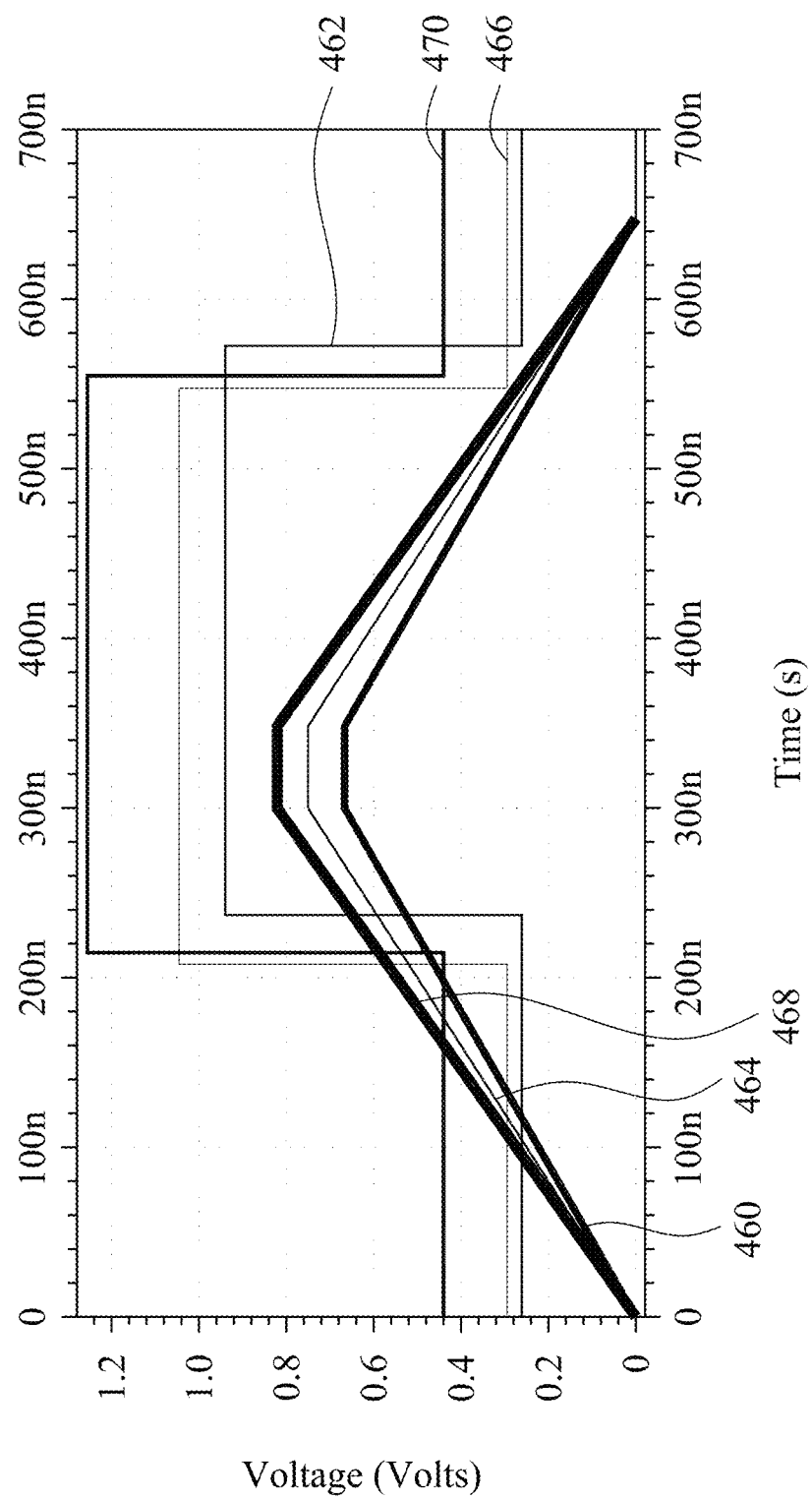
FIG. 4B is a plot of waveforms of the enablement operation and disablement operation of the POC in FIG. 4A, in accordance with some embodiments.

FIG. 4B is a plot of waveforms of the enablement operation and disablement operation of the POC circuit 400 in FIG. 4A, in accordance with some embodiments.

FIG. 4B is a plot of the enablement operation and the disablement operation at three different pairs of voltages where each pair includes a waveform for the core voltage and a waveform for the output voltage Vout. The three different pairs of voltages vary in the IO supply voltage level, the peak core supply voltage level, and the high ground voltage level.

Waveforms 460, 462 correspond to the core voltage (i.e., core voltage 460) and the output voltage (i.e., output voltage 462) during an enablement operation and a disablement operation of POC circuit 400 when the IO supply voltage level is ≈0.945 V, the peak of the core voltage level is ≈0.675 V, and the high ground voltage level is ≈0.27 V, in accordance with some embodiments.

In FIG. 4B, at time 0, POC circuit 400 receives core voltage 460 at a minimum level, which in this example is L_GND=≈0 V. Also at time 0, POC circuit 400 generates output voltage 462 at a minimum level, which in this example is at the high ground voltage level of ≈0.27 V. In this case, the high ground voltage level is the disabling voltage level of the output voltage 462. Also at time 0, POC circuit 400 begins to ramp up core voltage 460 from the minimum level of the core voltage to the peak level of the core voltage, which again in this example is at ≈0.675 V. However, core voltage 460 does not reach the peak level until the time of ≈300 ns.

In FIG. 4B at a time of ≈237 ns, core voltage 460 reaches a first trigger level, which in this example is at ≈0.520 V. In response, POC circuit 400 ramps up output voltage 462 from the minimum level (also the disabling voltage level in this case) to the peak level of the output voltage of ≈0.945 V which in this example is the IO supply voltage level. Output voltage 462 reaches the peak level (e.g., ≈0.945 V) at ≈240 ns. The peak level of the output voltage of ≈0.945 Volts is the enabling voltage level in this example. As such, once output voltage 462 is at the peak level of the output voltage of ≈0.945 Volts, a circuit block, such as controllable circuit 106 in FIG. 1, responds by transitioning from a disabled state to an enabled state.

Referring again to core voltage 460 in FIG. 4B, core voltage 460 reaches the peak of ≈0.675 V at the time of ≈300 ns and remains at the peak level until a time of ≈350 ns. At the time of ≈350 ns, POC circuit 400 begins to ramp down core voltage 460 from the peak level to the minimum level (in this case, L_GND=≈0 V). Core voltage 460 reaches the minimum level at a time of ≈650 ns.

In FIG. 4B before the time of ≈650 ns, at a time of ≈570 ns, core voltage 460 reaches a second trigger level, which in this example is at ≈0.19 Volts. In response, POC circuit 400 ramps down output voltage 462 from the peak level to the minimum level which in this example is the disabling voltage level. The disabling voltage level is the high ground voltage level. Output voltage 462 reaches the disabling voltage level at a time of ≈573 ns. As such, once output voltage 462 is at the minimum level of ≈0.27 Volts, a circuit block, such as controllable circuit 106 in FIG. 1, responds by transitioning from the enabled state to the disabled state.

In FIG. 4B, waveforms 464, 466 correspond to the core voltage (i.e., core voltage 464) and the output voltage (i.e., output voltage 466) during an enablement operation and a disablement operation of POC circuit 400. When the IO supply voltage level is ≈1.05 V, the peak level of the core voltage is ≈0.75 V, and the high ground voltage level is ≈0.30 V, in accordance with some embodiments.

In FIG. 4B at time 0, POC circuit 400 receives core voltage 464 at a minimum level, which in this example is L_GND=≈0 V. Also at time 0, POC circuit 400 generates output voltage 466 at a minimum level which in this example is at the high ground voltage level of ≈0.30 V. In this case, the high ground voltage level is the disabling voltage level of the output voltage 466. Also at time 0, POC circuit 400 begins to ramp up core voltage 464 from the minimum level to the peak level, which again in this example is at ≈0.75 V. However, core voltage 464 does not reach the peak level until the time of ≈300 ns.

In FIG. 4B at a time of ≈207 ns, core voltage 464 reaches a first trigger level which in this example is at ≈0.520 V. In response, POC circuit 400 ramps up output voltage 466 from the minimum level (also the disabling voltage level in this case) to the peak level of ≈1.05 V which in this example is the IO supply voltage level. Output voltage 466 reaches the peak level (e.g., ≈1.05 V) at ≈210 ns. The peak level of the output voltage of ≈1.05 V is the enabling voltage level in this example. As such, once output voltage 466 is at the peak level of ≈1.05 V, a circuit block, such as controllable circuit 106 in FIG. 1, responds by transitioning from a disabled state to an enabled state.

Referring again to core voltage 464 in FIG. 4B, core voltage 464 reaches the peak level of ≈0.75 V at the time of ≈300 ns and remains at the peak level until a time of ≈350 ns. At the time of ≈350 ns, POC circuit 400 begins to ramp down core voltage 464 from the peak level to the minimum level (in this case, L_GND=≈0 V). Core voltage 464 reaches the minimum level at a time of ≈650 ns.

In FIG. 4B before the time of ≈650 ns, at a time of ≈545 ns, core voltage 464 reaches a second trigger level which in this example is at ≈0.20 Volts. In response, POC circuit 400 ramps down output voltage 466 from the peak level to the minimum level which in this example is the disabling voltage level. The disabling voltage level is the high ground voltage level. Output voltage 466 reaches the disabling voltage level at a time of ≈548 ns. As such, once output voltage 466 is at the minimum level of ≈0.30 Volts, a controllable circuit, such as controllable circuit 106 in FIG. 1, responds by transitioning from the enabled state to the disabled state.

In FIG. 4B, voltage waveforms 468, 470 correspond to the core voltage (i.e., core voltage 468) and the output voltage (i.e., output voltage 470) during an enablement operation and a disablement operation of POC circuit 400. When the IO supply voltage level is ≈1.26 V, the peak level of the core voltage is ≈0.825V, and the high ground voltage level is ≈0.435 V, in accordance with some embodiments.

In FIG. 4B at time 0, POC circuit 400 receives core voltage 468 at a minimum level, which in this example is L_GND=≈0 V. Also at time 0, POC circuit 400 generates output voltage 470 at a minimum level which in this example is at the high ground voltage level of ≈0.435 V. In this case, the high ground voltage level is the disabling voltage level of the output voltage 470. Also at time 0, POC circuit 400 begins to ramp up core voltage 468 from the minimum level to the peak level which again in this example is at ≈0.825 V. However, core voltage 468 does not reach the peak level until the time of ≈300 ns.

In FIG. 4B at a time of ≈214 ns, core voltage 468 reaches a first trigger level, which in this example is ≈0.60 V. In response, POC circuit 400 ramps up output voltage 470 from the minimum level (also the disabling voltage level in this case) to the peak level of ≈1.26 V which in this example is the IO supply voltage level. Output voltage 470 reaches the peak level (e.g., ≈1.26 V) at ≈217 ns. The peak level of the output voltage of ≈1.26 V is the enabling voltage level in this example. As such, once output voltage 470 is at the peak level of ≈1.26 Volts, a controllable circuit, such as controllable circuit 106 in FIG. 1, responds by transitioning from a disabled state to an enabled state.

Referring again to core voltage 468 in FIG. 4B, core voltage 468 reaches the peak level of 0.825 V at the time of ≈300 ns and remains at the peak level until a time of ≈350 ns. At the time of ≈350 ns, POC circuit 400 begins to ramp down core voltage 468 from the peak level to the minimum level (in this case, L_GND=0 V). Core voltage 468 reaches the minimum level at a time of ≈650 ns.

In FIG. 4B before the time of ≈650 ns, at a time of ≈555 ns, core voltage 468 reaches a second trigger level which in this example is at 0.242 Volts. In response, POC circuit 400 ramps down output voltage 470 from the peak level to the minimum level, which in this example is the disabling voltage level. The disabling voltage level is the high ground voltage level. Output voltage 470 reaches the disabling voltage level at a time of ≈558 ns. As such, once output voltage 470 is at the minimum level of 0.435 Volts, a controllable circuit, such as controllable circuit 106 in FIG. 1, responds by transitioning from the enabled state to the disabled state.

Figure 5:
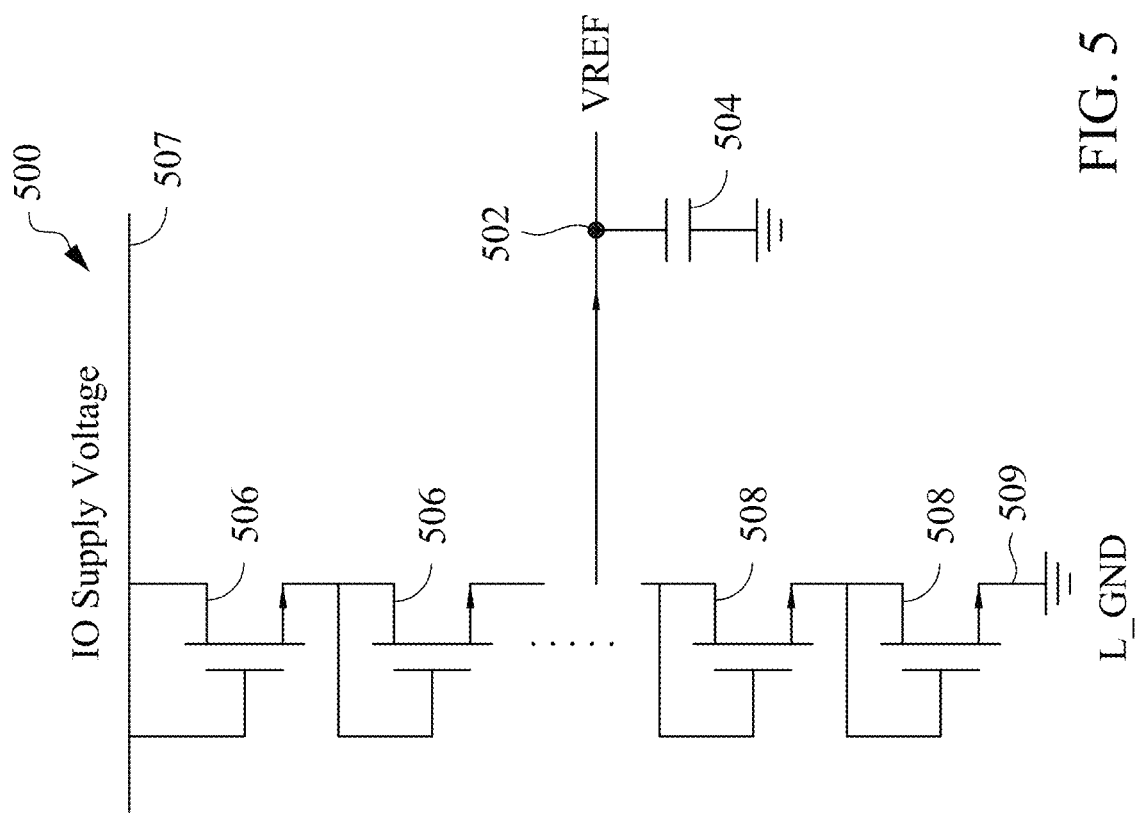
FIG. 5 is a circuit diagram of a reference voltage generator, in accordance with some embodiments.

FIG. 5 is a circuit diagram of a reference voltage generator 500, in accordance with some embodiments.

POC circuit 500 is an example of a part of POC circuit 104 in FIG. 1.

Reference voltage generator 500 is configured to generate reference voltage VREF at the peak core supply voltage level. Reference voltage generator 500 includes a reference node 502, a capacitive device 504, a plurality of NFETs 506, and a plurality of NFETs 508. Reference voltage generator 500 is configured to generate reference voltage VREF at reference node 502. Reference voltage VREF is used, e.g., in FIGS. 4A and 6-8. Capacitive device 504 is coupled in shunt at reference node 502 and is charged to reference voltage VREF.

NFETs 506 are connected in series between a power supply node 507 and reference node 502. Each of NFETs 506 has a gate coupled to its own drain in a diode configuration. Power supply node 507 is configured to receive the IO supply voltage. There are an integer number N of the NFETs 506 where N is greater or equal to two. NFETs 508 are connected in series between reference node 502 and ground node 509 at L_GND. Each of NFETs 508 has a gate coupled to its own drain in a diode configuration. There are an integer number M of the NFETs 506 where M is greater than or equal to two. In the example of FIG. 5, it is assumed that that knee voltage of each of diode-configured NFETs 506 and 508 is 0.1 v, the IO supply voltage is 1.2 v, VREF=0.9 at node 502 is 0.9 v and L_GND=0 v. Accordingly, in the example of FIG. 5, N=3 and M=9 such that N+M=12, i.e., 1.2 v−3*0.1 v=0.9 v. In some embodiments, the knee voltage of each of NFETs 506 and 508 is a voltage other than 0.1 v. In some embodiments, N and M are equal. In other embodiments, N and M are not equal. In some embodiments, each of the active devices in FIG. 5 is formed from a corresponding core device. In some embodiments, some or all of the instances of NFET 506 are replaced with a resistor. In some embodiments, some or all of the instances of NFET 508 are replaced with a resistor. More generally, in some embodiments, reference voltage generator 500 is based on an arrangement other than a series connection of diodes.

Figure 6:
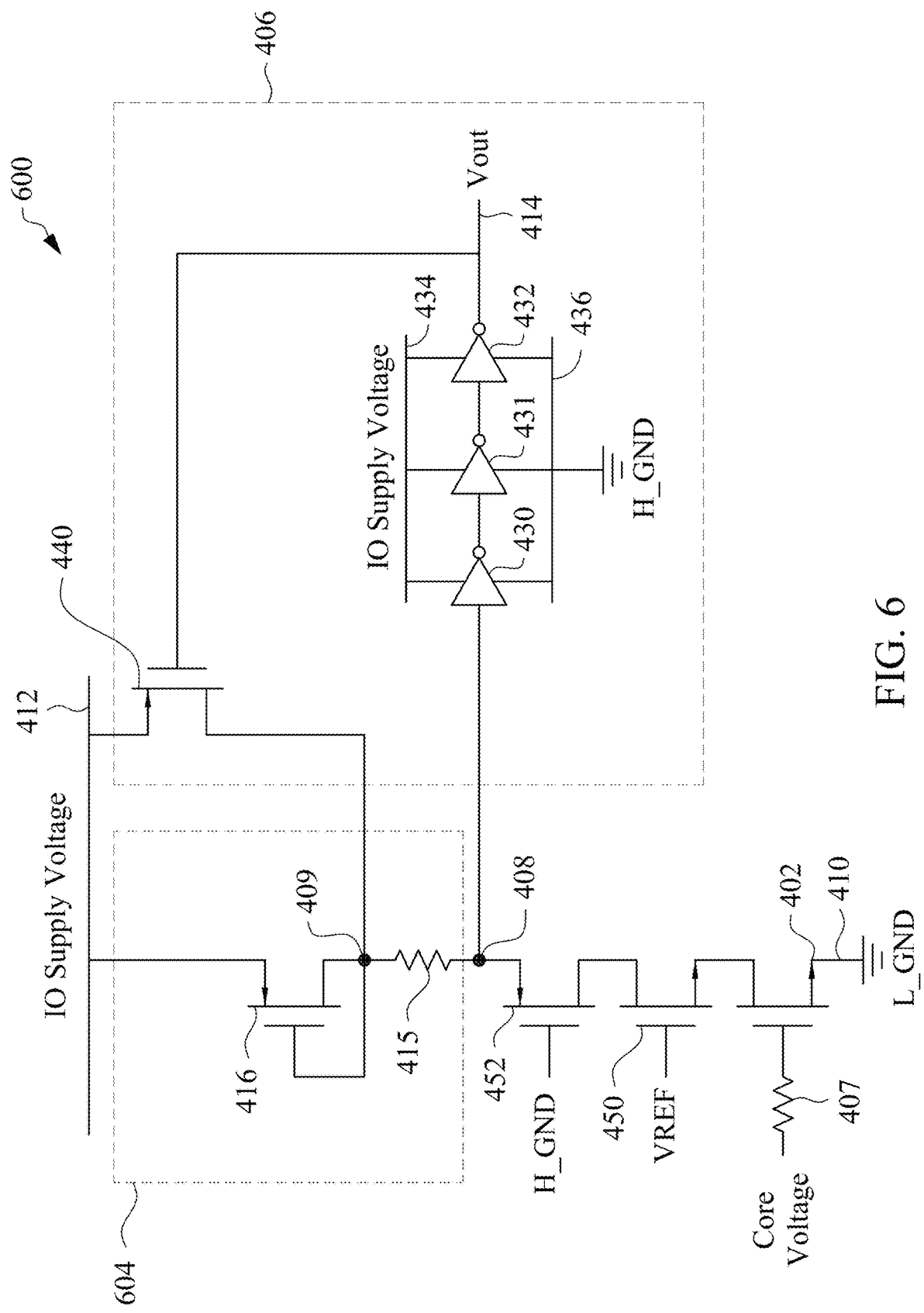
FIG. 6 is a circuit diagram of a POC, in accordance with some embodiments.

FIG. 6 is a circuit diagram of a POC circuit 600, in accordance with some embodiments.

POC circuit 600 is an example of POC circuit 104 in FIG. 1.

POC circuit 600 is similar to POC circuit 400 in FIG. 4A and similar elements are labeled with the same element numbers in FIG. 6 as in FIG. 4A. However, in FIG. 6, POC circuit 600 includes resistive block 604 instead of resistive block 404. In FIG. 6, resistive block 604 includes PFET 416 and resistor 415, like the resistive block 404 in FIG. 4A. However, resistive block 604 in FIG. 6 does not include NFET 417. In some embodiments, by removing NFET 417, the footprint of POC circuit 600 is reduced in comparison with POC circuit 400 in FIG. 4A. In FIG. 6, the source of PFET 416 is connected to power supply node 412. In some embodiments, resistive values of one or more of PFET 416 and resistor 415 are higher in resistive block 604 in FIG. 6 than in resistive block 404 in FIG. 4A. In some embodiments, resistive block 604 has a resistive value of ≈1 Megaohm. In some embodiments, each of the active devices in FIG. 6 is formed from a corresponding core device.

Figure 7:
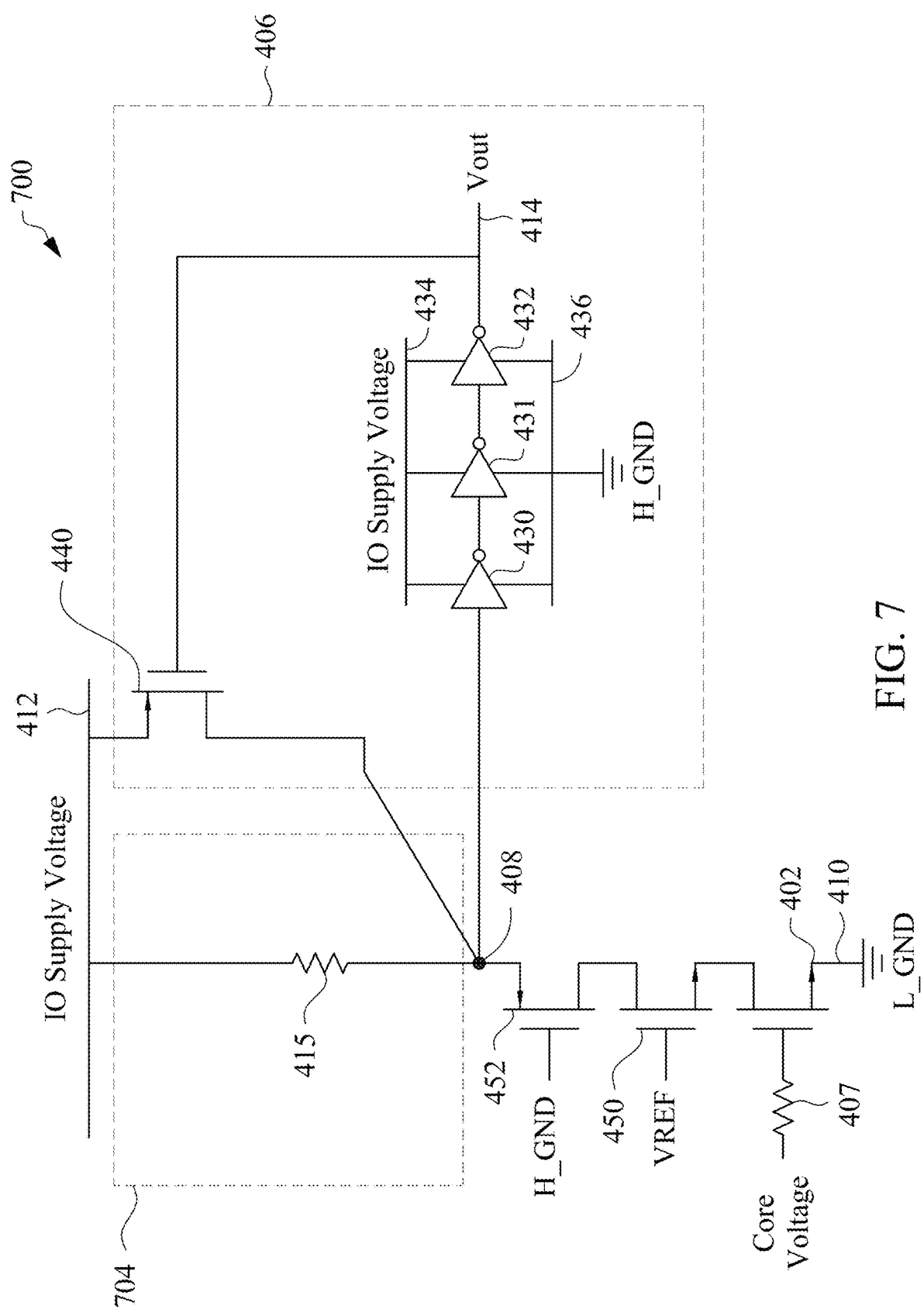
FIG. 7 is a circuit diagram of a POC, in accordance with some embodiments.

FIG. 7 is a circuit diagram of a POC circuit 700, in accordance with some embodiments.

POC circuit 700 is an example of POC circuit 104 in FIG. 1.

POC circuit 700 is similar to POC circuit 400 in FIG. 4A and similar elements are labeled with the same element numbers in FIG. 7 as in FIG. 4A. However, in FIG. 7, POC circuit 700 includes resistive block 704 instead of resistive block 404. In FIG. 7, resistive block 704 includes resistor 415, like the resistive block 404 in FIG. 4A. However, resistive block 704 in FIG. 7 does not include PFET 416 and NFET 417. Accordingly, in FIG. 7, the resistor is connected between power supply node 412 and control node 408. Furthermore, drain of PFET 440 is connected to the control node 408 since there is no intermediary node 409. In some embodiments, by removing PFET 416 and NFET 417 and connecting the drain of PFET 440 to control node 408, footprint of POC circuit 700 is more reduced in comparison to POC circuit 400 in FIG. 4A. In some embodiments, resistive value of resistor 415 is higher in resistive block 704 in FIG. 7 than in resistive block 404 in FIG. 4A. In some embodiments, resistive block 704 has a resistive value of 1 Megaohm. In some embodiments, each of the active devices in FIG. 7 is formed from a corresponding core device.

Figure 8:
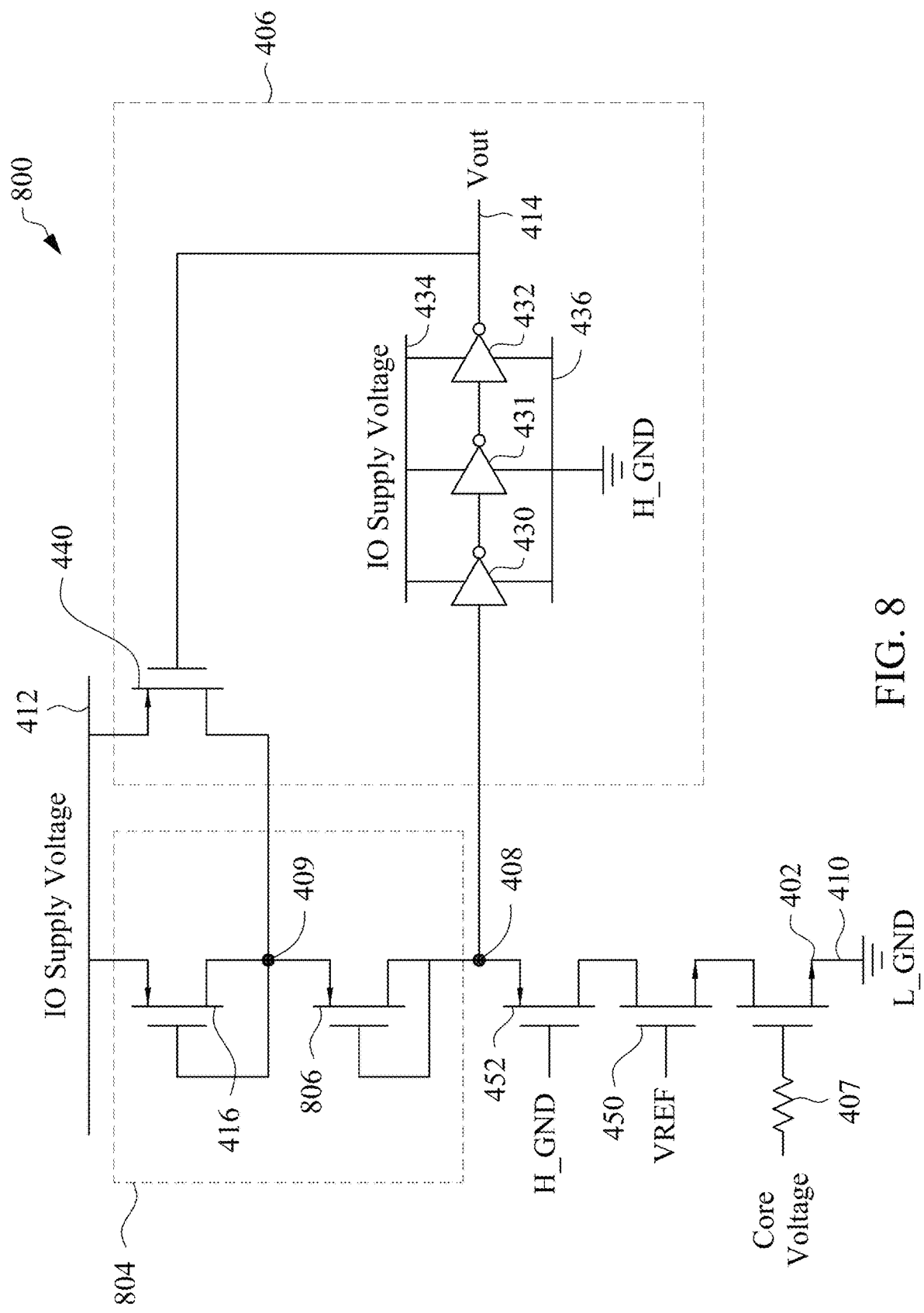
FIG. 8 is a circuit diagram of a POC, in accordance with some embodiments.

FIG. 8 is a circuit diagram of a POC circuit 800, in accordance with some embodiments.

POC circuit 800 is an example of POC circuit 104 in FIG. 1.

POC circuit 800 is similar to POC circuit 400 in FIG. 4A and similar elements are labeled with the same element numbers in FIG. 8 as in FIG. 4A. However, in FIG. 8, POC circuit 800 includes resistive block 804 instead of resistive block 404. In FIG. 8, resistive block 804 includes PFET 416, like the resistive block 404 in FIG. 4A. However, resistive block 804 in FIG. 8 does not include resistor 415 and NFET 417. Instead, resistive block 804 includes PFET 416 and a PFET 806. In some embodiments, by removing resistor 415 and NFET 417 and adding PFET 416 and PFET 806, footprint of POC circuit 800 is reduced in comparison to POC circuit 400 in FIG. 4A. In FIG. 8, the source of PFET 416 is connected to power supply node 412. The gate and drain of PFET 416 are connected to the intermediary node 409. In FIG. 8, the source of PFET 806 is connected to the intermediary node 409. The gate and the drain of PFET 806 are connected to the control node 408. In some embodiments, resistive block 804 has a resistive value of 1 Megaohm. In some embodiments, each of the active devices in FIG. 8 is formed from a corresponding core device.

Figure 9A:
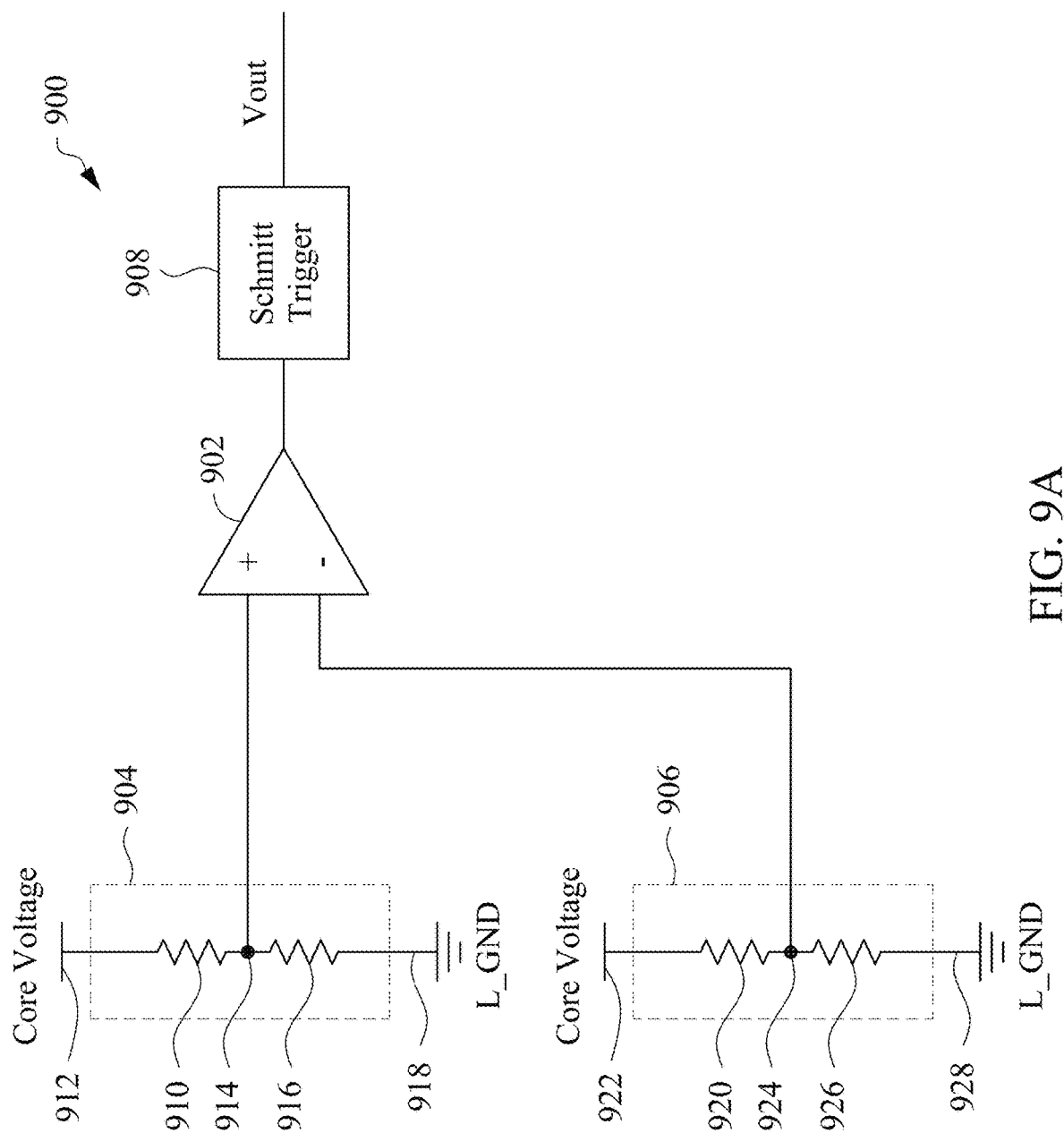
FIG. 9A is a block diagram of a POC, in accordance with some embodiments.

FIG. 9A is a block diagram of a POC circuit 900, in accordance with some embodiments.

POC circuit 900 is an example of POC circuit 104 in FIG. 1.

POC circuit 900 includes an op-amp 902, a first circuit branch 904, a second circuit branch 906, and a hysteresis block 908. In some embodiments, each of the active devices in FIG. 9A is formed from a corresponding core device.

First circuit branch 904 is connected between a power supply node 912 and a ground node 918. A non-inverting terminal of op-amp 902 is connected to a control node 914 within first circuit branch 904. Second circuit branch 906 is connected between a power supply node 922 and a ground node 928. An inverting terminal of op-amp 902 is connected to a control node 924 within second circuit branch 906. An output terminal of op-amp 902 is connected to an input terminal of hysteresis block 908. Hysteresis block 908 generates an output voltage Vout at an output terminal of hysteresis block 908.

In FIG. 9A, first circuit branch 904 includes a resistor 910 connected between power supply node 912 and control node 914. Power supply node 912 is configured to receive the core voltage. Control node 914 is connected to the non-inverting terminal of op-amp 902. First circuit branch 904 includes a resistor 916 connected between control node 914 and ground node 918. Ground node 918 is configured to receive L_GND.

Second circuit branch 906 includes a resistor 920 connected between power supply node 922 and control node 924. Power supply node 922 is also configured to receive the core voltage. Control node 924 is connected to the inverting terminal of op-amp 902. Second circuit branch 906 includes a diode 926 connected between control node 924 and ground node 928. Ground node 918 is configured to receive L_GND. An anode of the diode 926 is connected to control node 924 and a cathode of diode 926 is connected to ground node 928.

Output terminal of op-amp 902 is connected to input terminal of hysteresis block 908. Hysteresis block 908 is configured to generate output voltage Vout at output terminal of hysteresis block 908. In some embodiments, each of diode 926, op-amp 902, and hysteresis block 908 is formed from a corresponding core device. In FIG. 9A, hysteresis block 908 is a Schmitt trigger.

Figure 9B:
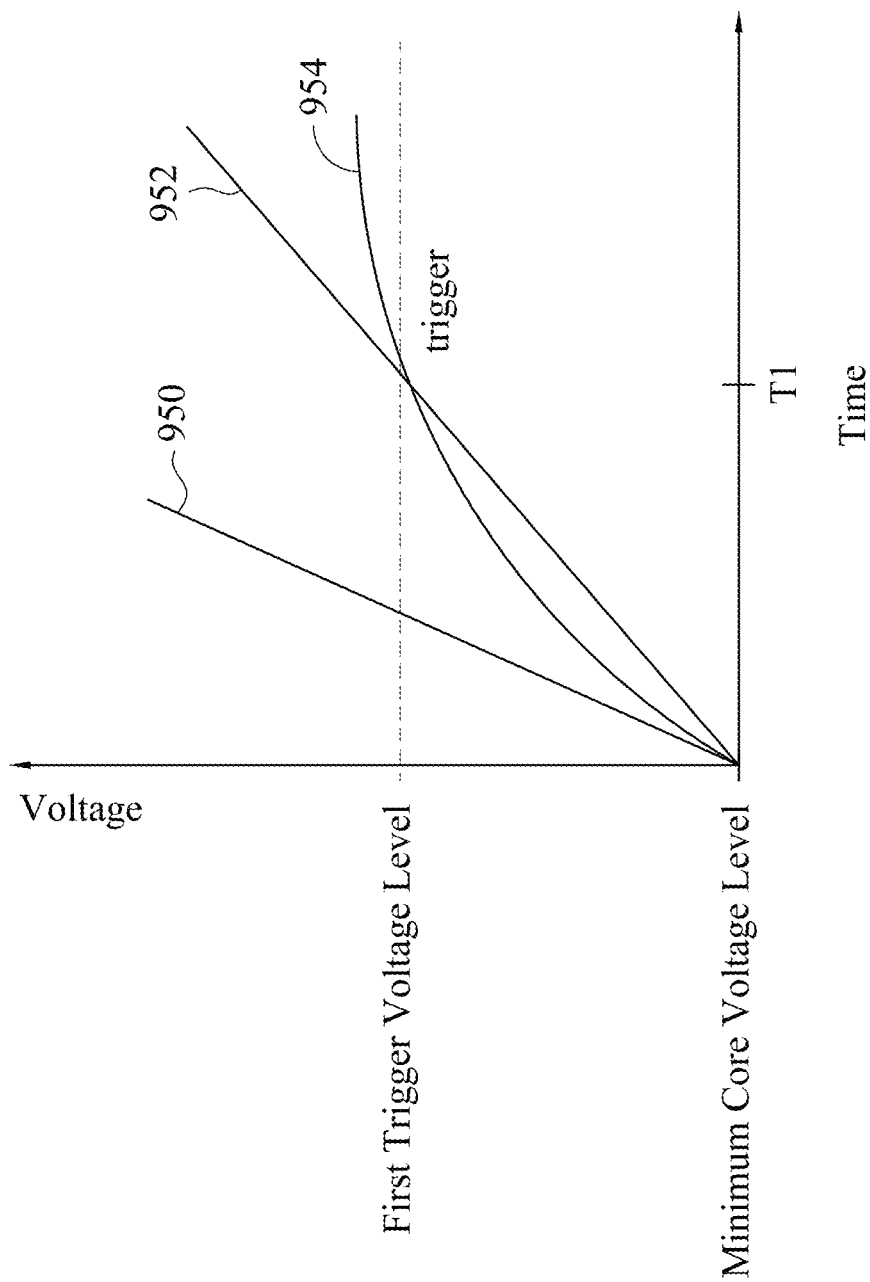
FIG. 9B shows waveforms associated with an enablement operation of POC in FIG. 9A, in accordance with some embodiments.

FIG. 9B shows waveforms associated with an enablement operation of POC circuit 900 in FIG. 9A, in accordance with some embodiments.

Waveform 950 demonstrates the core voltage (i.e., core voltage 950) ramping up from a disabling voltage level to an enabling voltage level (not shown in FIG. 9B). Waveform 952 demonstrates the control voltage (i.e., control voltage 952) at control node 914, which is input into the non-inverting terminal of op-amp 902 from first circuit branch 904. Waveform 954 demonstrates the control voltage (i.e., control voltage 906) at control node 924, which is input into the inverting terminal of op-amp 902.

Initially, as core voltage 950 ramps up from the minimum level, control voltage 952 and control voltage 954 follow core voltage 950. However, once diode 926 in second circuit branch 906 saturates at time T1, control voltage 954 levels off at a first trigger level while control voltage 952 continues to follow the core voltage 950. Accordingly, control voltage 952 has a voltage level that is higher than a voltage level of control voltage 954. Thus, at time T1, hysteresis block 908 responds to voltage at the output terminal of op-amp 902 by causing output voltage Vout to change, rising from the disabling voltage level to the enabling voltage level. A waveform (not shown) for output voltage Vout of FIG. 9A during the enablement operation is similar to the waveform of output voltage Vout in FIG. 2D.

Figure 9C:
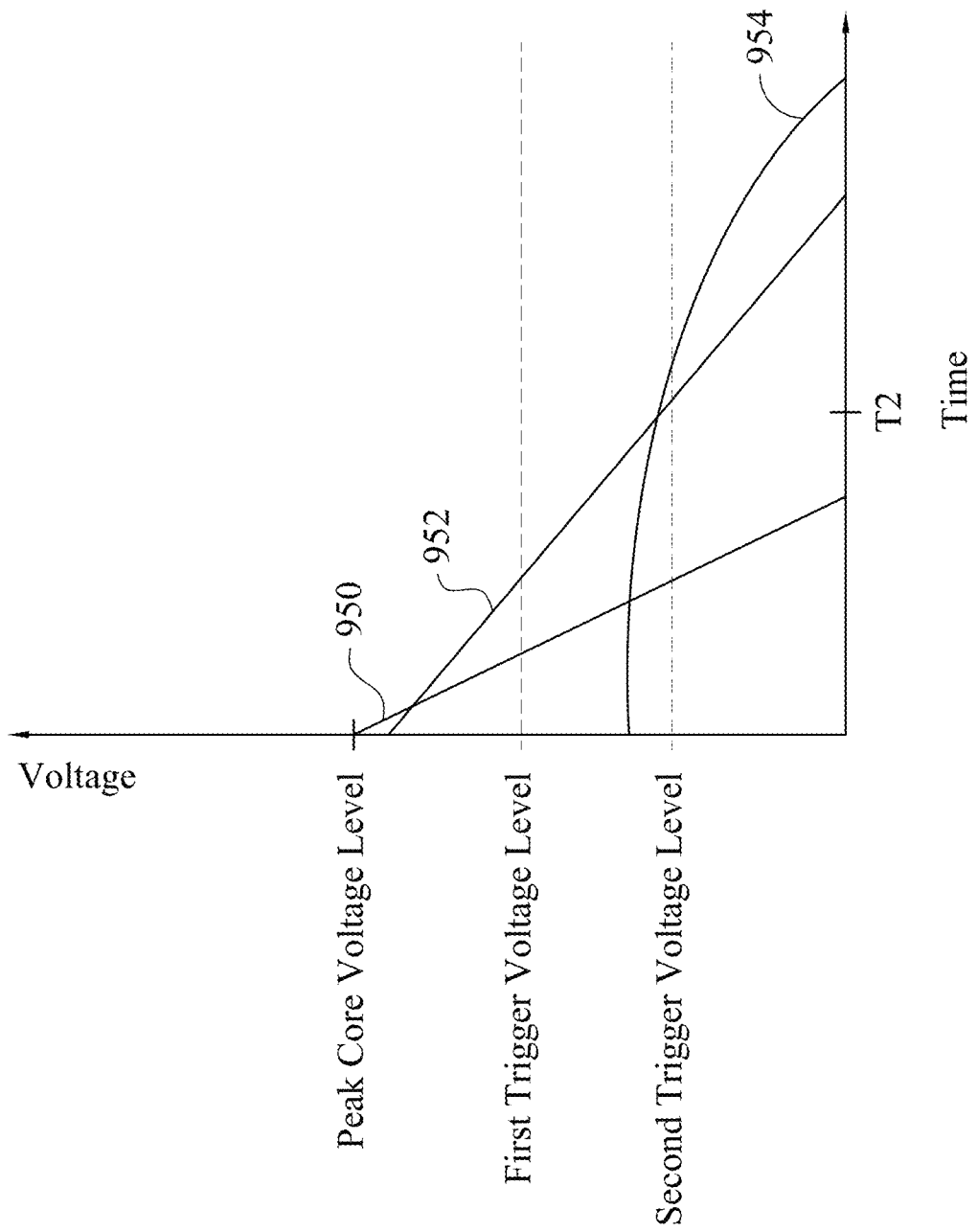
FIG. 9C shows waveforms associated with a disablement operation of POC in FIG. 9A, in accordance with some embodiments.

FIG. 9C shows waveforms associated with a disablement operation of POC circuit 900 in FIG. 9A, in accordance with some embodiments.

Initially, as core voltage 950 ramps down from the peak level, control voltage 952 follows core voltage 950. Diode 926 is saturated so that control voltage 954 remains level at a second trigger level. The first trigger level is greater than the second trigger level. However, at time T2, both control voltage 952 and control voltage 954 follow core voltage 950 since diode 926 in second circuit branch 906 is forced out of saturation mode and into a linear mode. Accordingly, control voltage 952 has a voltage level that is lower than a voltage level of control voltage 954 at time T2. Thus, at time T2, hysteresis block 908 responds to voltage at the output terminal of op-amp 902 by causing output voltage Vout to change, falling from the enabling voltage level to the disabling voltage level. A waveform (not shown) for output voltage Vout of FIG. 9A during the disablement operation is similar to the waveform of output voltage Vout in FIG. 2G.

Figure 10:
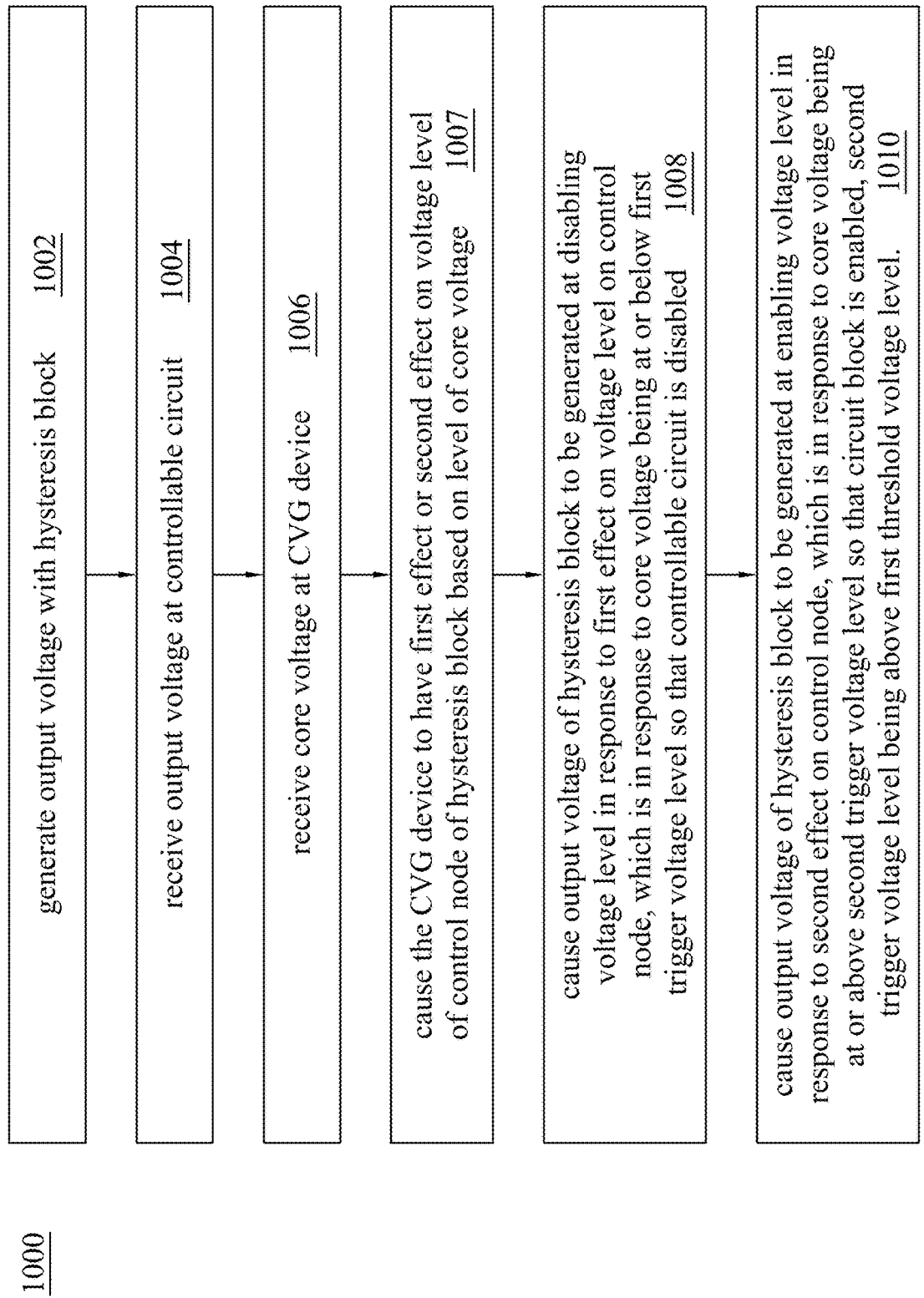
FIG. 10 is a flow diagram of a method of enabling and disabling a circuit block, in accordance with some embodiments.

FIG. 10 is a flow diagram 1000 of a method of enabling and disabling a controllable circuit, in accordance with some embodiments.

Flow begins at block 1002. At block 1002, an output voltage is generated with hysteresis block. Examples of output voltage include voltage Vout in FIGS. 2A, 2D, 2G, 3, 4A, 4B, 6, 7, 8, or the like. Examples of hysteresis block include hysteresis block 206 in FIG. 2A, 3, hysteresis block 406 in FIG. 4A, 6, 7, or the like. Flow then proceeds to block 1004.

At block 1004, the output voltage is received at a controllable circuit. An example of the controllable circuit is controllable circuit 106 in FIG. 1, or the like. Flow then proceeds to block 1006.

At block 1006, core voltage is received at a core-voltage-gaged (CVG) device. Examples of core voltage are shown in FIGS. 2A, 2B, 2E, 3, 4A, 4B, 6, 7, 8, or the like. More particularly, examples of the CVG device are CVG device 202 in FIGS. 2A, 3, CVG device 402 in FIGS. 4A, 6, 7, 8, or the like. Flow then proceeds to block 1008.

At block 1007, CVG device is caused to have a first effect or a second effect on a voltage level of a control node of the hysteresis block based on a level of the core voltage. Examples of the first effect and the second effect correspondingly include pulling down the control voltage from the peak control voltage level to at or below a trigger voltage level of the control voltage, as shown in FIG. 2C, and pulling up the control voltage from the minimum control voltage level to another trigger voltage level of the control voltage, as in FIG. 2F.

At block 1008, the CVG device causes the output voltage of the hysteresis block to be generated at a disabling voltage level in response to the first effect on the voltage level on the control node, which is in response to core voltage being at or below a first trigger level so that the controllable circuit is disabled. Examples of disabling voltage operation are shown in FIGS. 2E-2G, FIG. 4B, or the like. An example of the first trigger level is shown as the second trigger level in FIG. 2E, or the like. Flow then proceeds to block 1010.

At block 1010, the CVG device causes the output voltage of hysteresis block to be generated at an enabling voltage level in response to the second effect on the voltage level on the control node, which is in response to core voltage being at or above a second trigger level so that controllable circuit is enabled. Examples of enabling voltage operation are shown in FIGS. 2B-2D, FIG. 4B, or the like. An example of the second trigger level is shown as the first trigger level in FIGS. 2B, 2E, or the like.

In some embodiments, a semiconductor device, includes: a hysteresis block configured to generate an output voltage at a disabling voltage level and at an enabling voltage level, wherein an input terminal of the hysteresis block is coupled to a control node; and a core-voltage-gated (CVG) device coupled to the control node, wherein the CVG device is configured to receive a core voltage, the CVG device further being configured to: alter a control voltage at the control node so as to cause the output voltage of the hysteresis block to be generated at the disabling voltage level in response to the core voltage being at or below a first trigger level; and alter the control voltage at the control node so as to cause the output voltage of the hysteresis block to be generated at the enabling voltage level in response to the core voltage being at or above a second trigger level, the second trigger level being above the first trigger level. In some embodiments, the semiconductor device further includes: one or more resistive devices; and wherein: the CVG device is coupled between a control node and a ground node configured to receive a ground voltage; the one or more resistive devices are coupled between a power supply node and the control node, the power supply node being configured to receive an input/output supply voltage (IO supply voltage); and the hysteresis block has an input terminal coupled to the control node. In some embodiments, the CVG device is further configured to pull the control node towards the IO supply voltage in response to the core voltage ramping down from a peak core voltage level towards the ground voltage so as to cause the output voltage of the hysteresis block to be generated at the disabling voltage level in response to the core voltage being at or below the first trigger level, the first trigger level being between the peak core voltage level and a ground voltage level of the ground voltage; and the CVG device is configured to pull the control node towards the ground voltage in response to the core voltage ramping up from the ground voltage level to the peak core voltage level so as to cause the output voltage of the hysteresis block to be generated at the enabling voltage level in response to the core voltage being at or above the second trigger level, wherein the second trigger level is between the peak core voltage level and the ground voltage level of the ground voltage. In some embodiments, the ground voltage is at a VSS. In some embodiments, the ground voltage is at a high ground voltage level that is above VSS. In some embodiments, the CVG device includes a first NFET having a first gate configured to receive the core voltage, a first drain coupled to the control node, and a first source coupled to a ground node; the one or more resistive devices include a resistor coupled between the power supply node and the control node. In some embodiments, the semiconductor device further includes: a second NFET and a first PFET; and wherein: the second NFET includes a second gate, a second drain, and a second source; the first PFET includes a third gate, a third drain, and a third source; the third source is coupled to the control node; the third drain is coupled to the second drain; the second source is coupled to the first drain; the ground voltage is at VSS; the second gate is configured to receive a reference voltage at a peak core voltage level of the core voltage; and the third gate is configured to receive a second ground voltage at a high ground voltage level, the high ground voltage level being above the ground voltage. In some embodiments, the one or more resistive devices include a first NFET, a first PFET, and a resistor; the first NFET is diode-connected and is coupled between the power supply node and the first PFET; the first PFET is diode-connected and is coupled between the first NFET and the resistor; and the resistor is connected between the first PFET and the control node. In some embodiments, the hysteresis block includes inverters and a second PFET; the inverters are connected in series and there are an integer number of the inverters where the integer number is odd; the inverters are connected between the control node and an output node configured to output the output voltage; a gate of the second PFET is coupled to the output node; a source of the second PFET is coupled to the power supply node; and a drain of the second PFET is coupled between the first PFET and the resistor. In some embodiments, the one or more resistive devices include a first PFET and a resistor; the first PFET is diode-connected and is coupled between the power supply node and the resistor; the resistor is connected between the first PFET and the control node. In some embodiments, the hysteresis block includes inverters and a second PFET; and the inverters are connected in series and there are an integer number of the inverters where the integer number is odd; the inverters are connected between the control node and an output node configured to output the output voltage; a gate of the second PFET is coupled to the output node; a source of the second PFET is coupled to the power supply node; and a drain of the second PFET is coupled between the first PFET and the resistor. In some embodiments, the one or more resistive devices include a resistor; and the resistor is connected between the power supply node and the control node. In some embodiments, the hysteresis block includes inverters and a PFET; the inverters are connected in series and there are an integer number of the inverters where the integer number is odd; the inverters are connected between the control node and an output node configured to output the output voltage; a gate of the PFET is coupled to the output node; a source of the PFET is coupled to the power supply node; and a drain of the PFET is coupled to the control node. In some embodiments, the one or more resistive devices include a first NFET and a first PFET; the first PFET is diode-connected and is coupled between the power supply node and the first NFET; and the first NFET is diode-connected and is coupled between the first PFET and the control node. In some embodiments, the hysteresis block includes inverters and a second PFET; the inverters are connected in series and there are an integer number of the inverters where the integer number is odd; the inverters are connected between the control node and an output node configured to output the output voltage; a gate of the second PFET is coupled to the output node; a source of the second PFET is coupled to the power supply node; and a drain of the second PFET is coupled between the first NFET and the first PFET.

In some embodiments, a semiconductor device, including: one or more resistive devices coupled between a power supply node and a control node, the power supply node being configured to receive an input/output supply voltage (IO supply voltage); a first NFET having a first gate configured to receive a core voltage, a first drain coupled to the control node, and a first source coupled to a ground node configured to receive a first ground voltage; a hysteresis block connected to the control node and to an output node, the hysteresis block being configured to: generate an output voltage at the output node at a disabling voltage level in response to the core voltage causing the first NFET to pull the control node above a first trigger level; and generate the output voltage at the output node at an enabling voltage level in response to the core voltage causing the first NFET to pull the control node below a second trigger level, the first trigger level being above the second trigger level. In some embodiments, the first ground voltage is at VSS. In some embodiments, the first ground voltage is at a high ground voltage level that is above the ground voltage level. In some embodiments, the hysteresis block includes inverters and a PFET; the inverters are connected in series, there being an odd integer number of the inverters; the inverters are connected between the control node and the output node; a gate of the PFET is coupled to the output node; a source of the PFET is coupled to the power supply node; and a drain of the PFET is coupled either: to the control node; or between resistive devices of the one or more resistive devices.

In some embodiments, a method of enabling a controllable circuit, the method including: generating an output voltage with a hysteresis block; receiving the output voltage at the controllable circuit; receiving a core voltage at a core-voltage-gated (CVG) device; causing the CVG device to have a first effect or a second effect on a voltage level of a control node of the hysteresis block based on a level of the core voltage; causing the output voltage of the hysteresis block to be generated at a disabling voltage level in response to the first effect on the voltage level on the control node, which is in response to the core voltage being at or below a first trigger level so that the controllable circuit is disabled; and causing the output voltage of the hysteresis block to be generated at an enabling voltage level in response to the second effect on the voltage level on the control node, which is in response to the core voltage being at or above a second trigger level so that the controllable circuit is enabled, the second trigger level being above the first trigger level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a hysteresis block configured to generate an output voltage at a disabling voltage level and at an enabling voltage level, wherein an input terminal of the hysteresis block is coupled to a control node; and
a core-voltage-gated (CVG) device coupled to the control node, wherein the CVG device is configured to receive a core voltage, the CVG device further being configured to:
alter a control voltage at the control node so as to cause the output voltage of the hysteresis block to be generated at the disabling voltage level in response to the core voltage being at or below a first trigger level; and
alter the control voltage at the control node so as to cause the output voltage of the hysteresis block to be generated at the enabling voltage level in response to the core voltage being at or above a second trigger level, the second trigger level being above the first trigger level; and
one or more resistive devices coupled between a power supply node and the control node, wherein a resistive value is linear and independent of the control voltage at the control node, and there are no non-linear elements between the power supply node and the control node.

2. The semiconductor device of claim 1, wherein:
the CVG device is coupled between the control node and a ground node configured to receive a ground voltage;
the power supply node is configured to receive an input/output supply voltage (TO supply voltage); and
the hysteresis block has an input terminal coupled to the control node.

3. The semiconductor device of claim 2, wherein:
the CVG device is further configured to pull the control node towards the TO supply voltage in response to the core voltage ramping down from a peak core voltage level towards the ground voltage so as to cause the output voltage of the hysteresis block to be generated at the disabling voltage level in response to the core voltage being at or below the first trigger level, the first trigger level being between the peak core voltage level and a ground voltage level of the ground voltage; and
the CVG device is configured to pull the control node towards the ground voltage in response to the core voltage ramping up from the ground voltage level to the peak core voltage level so as to cause the output voltage of the hysteresis block to be generated at the enabling voltage level in response to the core voltage being at or above the second trigger level, wherein the second trigger level is between the peak core voltage level and the ground voltage level of the ground voltage.

4. The semiconductor device of claim 2, wherein the ground voltage is at a VSS.

5. The semiconductor device of claim 2, wherein the ground voltage is at a level that is above VSS.

6. The semiconductor device of claim 2, wherein:
the CVG device includes a first NFET having a first gate configured to receive the core voltage, a first drain coupled to the control node, and a first source coupled to a ground node;
the one or more resistive devices include a resistor coupled between the power supply node and the control node.

7. The semiconductor device of claim 6, further comprising:
a second NFET and a first PFET; and
wherein:
the second NFET includes a second gate, a second drain, and a second source;
the first PFET includes a third gate, a third drain, and a third source;
the third source is coupled to the control node;
the third drain is coupled to the second drain;
the second source is coupled to the first drain;
the ground voltage is at VSS;
the second gate is configured to receive a reference voltage at a peak core voltage level of the core voltage; and
the third gate is configured to receive a second ground voltage at a high ground voltage level, the high ground voltage level being above the ground voltage.

8. The semiconductor device of claim 1, wherein:
the hysteresis block includes inverters and a second PFET;
the inverters are connected in series and there are an integer number of the inverters where the integer number is odd;
the inverters are connected between the control node and an output node configured to output the output voltage;
a gate of the second PFET is coupled to the output node;
a source of the second PFET is coupled to the power supply node; and
a drain of the second PFET is coupled to a node between a PFET and one of the resistive devices.

9. The semiconductor device of claim 2, wherein:
the one or more resistive devices include a resistor connected between the power supply node and the control node.

10. The semiconductor device of claim 9, wherein:
the hysteresis block includes inverters and a second PFET; and
the inverters are connected in series and there are an integer number of the inverters where the integer number is odd;
the inverters are connected between the control node and an output node configured to output the output voltage;
a gate of the second PFET is coupled to the output node;
a source of the second PFET is coupled to the power supply node; and
a drain of the second PFET is coupled to a node between a first PFET and the resistor.

11. The semiconductor device of claim 2, wherein:
the one or more resistive devices include a resistor; and
the resistor is connected between the power supply node and the control node.

12. The semiconductor device of claim 11, wherein:
the hysteresis block includes inverters and a PFET;
the inverters are connected in series and there are an integer number of the inverters where the integer number is odd;
the inverters are connected between the control node and an output node configured to output the output voltage;
a gate of the PFET is coupled to the output node;
a source of the PFET is coupled to the power supply node; and
a drain of the PFET is coupled to the control node.

13. The semiconductor device of claim 1, wherein:
the hysteresis block includes inverters and a second PFET;
the inverters are connected in series and there are an integer number of the inverters where the integer number is odd;
the inverters are connected between the control node and an output node configured to output the output voltage;
a gate of the second PFET is coupled to the output node;
a source of the second PFET is coupled to the power supply node; and
a drain of the second PFET is coupled to a node between a first NFET and a first PFET.

14. A semiconductor device, comprising:
one or more resistive devices coupled between a power supply node and a control node and having a linear resistive value, and there are no non-linear elements between the power supply node and the control node between the power supply node and the control node, the power supply node being configured to receive an input/output supply voltage (TO supply voltage);
a first NFET having a first gate configured to receive a core voltage, a first drain coupled to the control node, and a first source coupled to a ground node configured to receive a first ground voltage;
a hysteresis block connected to the control node and to an output node, the hysteresis block being configured to:
generate an output voltage at the output node at a disabling voltage level in response to the core voltage causing the first NFET to pull the control node above a first trigger level; and
generate the output voltage at the output node at an enabling voltage level in response to the core voltage causing the first NFET to pull the control node below a second trigger level, the first trigger level being above the second trigger level.

15. The semiconductor device of claim 14, wherein:
the first ground voltage is at VSS.

16. The semiconductor device of claim 14, wherein:
the first ground voltage is at a level that is above the ground voltage level.

17. The semiconductor device of claim 14, wherein:
the hysteresis block includes inverters and a PFET;
the inverters are connected in series, there being an odd integer number of the inverters;
the inverters are connected between the control node and the output node;
a gate of the PFET is coupled to the output node;
a source of the PFET is coupled to the power supply node; and
a drain of the PFET is coupled either:
 to the control node; or
 to a node between resistive devices of the one or more resistive devices.

18. The semiconductor device of claim 14, wherein the one or more resistive devices include a resistor connected between the power supply node and the control node.

19. A method of enabling a controllable circuit, the method comprising:
generating an output voltage with a hysteresis block;
receiving the output voltage at the controllable circuit;
receiving a core voltage at a core-voltage-gated (CVG) device;
providing one or more resistive devices coupled between a power supply node and a control node and forming a linear resistive value, and there are only linear elements between the power supply node and the control node between the power supply node and the control node;
causing the CVG device to have a first effect or a second effect on a voltage level of the control node of the hysteresis block based on a level of the core voltage;
causing the output voltage of the hysteresis block to be generated at a disabling voltage level in response to the first effect on the voltage level on the control node, which is in response to the core voltage being at or below a first trigger level so that the controllable circuit is disabled; and
causing the output voltage of the hysteresis block to be generated at an enabling voltage level in response to the second effect on the voltage level on the control node, which is in response to the core voltage being at or above a second trigger level so that the controllable circuit is enabled, the second trigger level being above the first trigger level.

20. The method of claim 19, further comprising:
causing the one or more resistive devices to function as a resistor that has a linear resistive value.

* * * * *